United States Patent [19]
Okamoto et al.

[11] Patent Number: 5,726,950
[45] Date of Patent: Mar. 10, 1998

[54] SYNCHRONOUS SEMICONDUCTOR MEMORY DEVICE PERFORMING INPUT/OUTPUT OF DATA IN A CYCLE SHORTER THAN AN EXTERNAL CLOCK SIGNAL CYCLE

[75] Inventors: Yasuyuki Okamoto; Ryuichi Matsuo. both of Hyogo, Japan

[73] Assignee: Mitsubishi Denki Kabushiki Kaisha. Tokyo, Japan

[21] Appl. No.: 779,829

[22] Filed: Jan. 7, 1997

[30] Foreign Application Priority Data

Feb. 22, 1996 [JP] Japan ................ 8-035109

[51] Int. Cl.$^6$ ........................ G11C 8/00
[52] U.S. Cl. ................ 365/233; 365/189.05
[58] Field of Search .............. 365/233, 189.05, 365/191, 194

[56] References Cited

U.S. PATENT DOCUMENTS

| | | | |
|---|---|---|---|
| 5,402,389 | 3/1995 | Flannagan et al. | 365/233 |
| 5,404,338 | 4/1995 | Murai et al. | 365/233 |
| 5,517,459 | 5/1996 | Ooishi | 365/230.08 |
| 5,592,434 | 1/1997 | Iwamoto et al. | 365/233 |

FOREIGN PATENT DOCUMENTS

| | | |
|---|---|---|
| 3-29871 | 2/1991 | Japan. |
| 07140207 A | 6/1995 | Japan. |

OTHER PUBLICATIONS

"*A 32K WORD ×32–Bit Synchronous Burst SRAM*", Shigeki OHBAYASHI et al. Mitsubishi Denki Giho: vol. 69, No. 6 pp. 78–83 (1995) no month.

*Primary Examiner*—David C. Nelms
*Assistant Examiner*—Son Mai
*Attorney, Agent, or Firm*—Lowe, Price, LeBlanc & Becker

[57] ABSTRACT

An input circuit 200 includes first to fourth switching transistors T1–T4 to be controlled by clock signals CLK and /CLK, and two latch circuits 202 and 204. In response to a rising edge of the clock signal, switching transistor T1 is turned on, and latch circuit 202 takes in data. In response to a falling edge of clock signal CLK, switching transistor T3 is turned on, and latch circuit 204 takes in the data. Since input and output of the data are performed at both the rising edge and the falling edge of the clock signal, the operation can be performed at double the frequency.

13 Claims, 19 Drawing Sheets n:ONE CYCLE
m:INTERNAL CYCLE TIME (1/2)
A:TAKE-IN POSITION
B:SECOND TAKE-IN POSITION n: ONE CYCLE
m: INTERNAL CYCLE TIME (1/2)
A: TAKE-IN POSITION
B: SECOND TAKE-IN POSITION
S1: STROBE 1
S2: STROBE 2 n:ONE CYCLE
m:INTERNAL CYCLE TIME(1/2)
A:TAKE-IN POSITION
B:SECOND TAKE-IN POSITION n:ONE CYCLE
m:INTERNAL CYCLE TIME (1/2)
A:TAKE-IN POSITION
B:SECOND TAKE-IN POSITION
S1:STROBE 1
S2:STROBE 2 n: ONE CYCLE
L: INTERNAL CYCLE TIME (1/4)
A: TAKE-IN POSITION
B: SECOND TAKE-IN POSITION n:ONE CYCLE
L:INTERNAL CYCLE TIME(1/4)
A:TAKE-IN POSITION
B:SECOND TAKE-IN POSITION
WS1:WINDOW STROBE 1
WS2:WINDOW STROBE 2 n: ONE CYCLE
L: INTERNAL CYCLE TIME (1/4)
A: TAKE-IN POSITION
B: SECOND TAKE-IN POSITION n:ONE CYCLE
L:INTERNAL CYCLE TIME (1/4)
A:TAKE-IN POSITION
B:SECOND TAKE-IN POSITION
WS1:WINDOW STROBE 1
WS2:WINDOW STROBE 2 n:ONE CYCLE
k:INTERNAL CYCLE TIME(1/8)
A:TAKE-IN POSITION
B:SECOND TAKE-IN POSITION n:ONE CYCLE
k:INTERNAL CYCLE TIME(1/8)
A:TAKE-IN POSITION
B:SECOND TAKE-IN POSITION
WS1:WINDOW STROBE 1
WS2:WINDOW STROBE 2 n: ONE CYCLE
k: INTERNAL CYCLE TIME (1/8)
A,B,C,D: TAKE-IN POSITION
A',B',C',D': SECOND TAKE-IN POSITION n: ONE CYCLE
k: INTERNAL CYCLE TIME (1/8)
A,B,C,D: TAKE-IN POSITION
A',B',C',D': SECOND TAKE-IN POSITION
WS1: WINDOW STROBE 1
WS2: WINDOW STROBE 2

SYNCHRONOUS SEMICONDUCTOR MEMORY DEVICE PERFORMING INPUT/ OUTPUT OF DATA IN A CYCLE SHORTER THAN AN EXTERNAL CLOCK SIGNAL CYCLE

BACKGROUND OF THE INVENTION

1. Field of the Invention

The present invention relates to a semiconductor memory device. In particular, the invention relates to a synchronous semiconductor memory device, which performs input/ output of data in synchronization with one or two kinds of external clock signals, and also relates to a method of writing data during a test of the device.

2. Description of the Background Art

As an operation speed of CPUs such as personal computers have been increased, so-called synchronous semiconductor memory devices such as a synchronous SRAM have been developed to support a secondary cache memory and others.

Operation speeds of synchronous SRAMs and synchronous DRAMs have recently been increased remarkably, and they can now use a clock signal of which maximum frequency is larger than 100 MHz (megahertz).

FIG. 21 is a circuit diagram showing a structure of a conventional input control circuit 1000, which takes in a signal upon rising (i.e., at a rising position) of an external clock signal during one cycle.

It is assumed that input control circuit 1000 is contained in an input register latching or an output register which latches input data or output data of a synchronous SRAM.

An input signal I1 is transmitted to a latch circuit formed of inverters IR1 and IR2 via an N-channel MOS transistor T1 controlled by a clock signal CLK1.

The signal held at the latch circuit is issued as a signal O1 via an N-channel MOS transistor T2, which is controlled by an inverted clock signal /CLK1 formed by inverting clock signal CLK1 by an inverter circuit IR3.

Input control circuit 1000 having the above structure is contained in the input or output register in the synchronous SRAM.

Operation will now be described below more in detail.

FIG. 22 is a timing chart showing an operation of input control circuit 1000.

At time t0, clock signal CLK1 is at L-level, transistor T1 is off, and transistor T2 is on.

At time t1, clock signal CLK1 rises to H-level. In response to this, transistor T1 is turned on, and transistor T2 is turned off. Thereby, the potential level of input signal I1 at time t1 is held by the latch circuit formed of inverters IR1 and IR2. Thus, an input node i1 of the latch circuit changes its level to L-level, and an output node i2 thereof changes its level to H-level.

During a cycle 2 starting from time t2, input signal I1 changes its level to H-level. In response to change in level of clock signal CLK1 to L-level, transistor T1 is turned off, and transistor T2 is turned on.

In response to the changes in level of transistors T1 and T2, the level of output signal O1 changes from H-level.

Therefore, the level of output signal O1 is fixed at H-level at time t3, i.e., at a rising edge of clock signal CLK1 in cycle 2. Thus, the signal taken into the latch circuit at time t1 is issued as the output signal at time t3. Therefore, a period from the take-in to the output of data requires a time period from time t1 to time t3, i.e., a time period equal to one cycle.

Similarly, the latch circuit takes in the potential level of input signal I1 at time t3, i.e., at the rising edge of clock signal CLK1 in cycle 2, and the value thereof is fixed as the level of output signal O1 at time t5, i.e., at the rising edge of clock signal CLK1 in a cycle 3.

An operation test of a synchronous SRAM or the like is performed in such a manner that an external test device applies a predetermined clock signal, and an address signal, test data or the like are input or output at every cycle in synchronization with the applied clock signal.

However, test devices themselves for an operation test of a synchronous SRAM or the like, which operate rapidly as described above, have not been improved to follow the increase in operation speed of the synchronous SRAM or the like to be tested.

If a test device allowing a rapid test were assembled in a process of manufacturing synchronous SRAM or the like, a cost of facilities would increase, so that the test cost and hence the chip cost would increase.

SUMMARY OF THE INVENTION

Accordingly, an object of the invention is to provide a synchronous semiconductor memory device such as a synchronous SRAM and a method of testing the same, which allow an efficient operation test at a frequency near an allowed maximum operation frequency of the synchronous semiconductor memory device using a test device having an allowed maximum test frequency of a relatively low value.

Another object of the invention is to reduce a test cost for a synchronous semiconductor memory device and hence a chip cost.

In brief, the present invention provides a synchronous semiconductor memory device for taking in external signals including a control signal, an address signal and a data signal in synchronization with an external clock signal. The synchronous semiconductor memory device includes a memory cell array, a control circuit, an address register, a memory cell select circuit, a data input circuit and a data OR circuit.

The memory cell array includes a plurality of memory cells arranged in rows and columns. The control circuit takes in the control signal in response to rising of the external clock signal. The address register takes in the address signal in response to rising of the external clock signal. The memory cell select circuit is controlled by the control circuit to read and write data into and from the memory cell corresponding to the address signal. The data input circuit receives the externally applied data signal and applies the same to the memory cell select circuit. The data output circuit receives the data from the memory cell select circuit and externally outputs the same. The data input circuit and the data output circuit are responsive to rising and falling of the external clock signal.

According to another aspect of the invention, a synchronous semiconductor memory device for taking in external signals including a control signal and an address signal in synchronization with an external clock signal, includes a memory cell array, a control circuit, an address register, a memory cell select circuit, a data input circuit and a data output circuit.

The memory cell array includes a plurality of memory cells arranged in rows and columns. The control circuit takes in the control signal in response to rising of the external clock signal. The address register takes in the address signal in response to rising of the external clock signal. The memory cell select circuit is controlled by the control circuit to read and write a data signal into and from the memory cell corresponding to the address signal. The data input circuit receives the externally applied data signal and applies the same to the memory cell select circuit. The data output circuit receives data from the memory cell select circuit and externally outputs the same. The data input circuit and the data output circuit take in the data signal in response to rising of the external clock signal and rising of an external sub-clock signal having a phase opposite to that of the external clock signal.

According to still another aspect of the invention, a synchronous semiconductor memory device for taking in external signals including a control signal and an address signal in synchronization with an external clock signal, includes a memory cell array, a control circuit, an address register, a memory cell select circuit, a data input circuit and a data output circuit.

The memory cell array includes a plurality of memory cells arranged in rows and columns. The control circuit takes in the control signal in response to rising of the external clock signal. The address register takes in the address signal in response to rising of the external clock signal. The memory cell select circuit is controlled by the control circuit to read and write a data signal into and from the memory cell corresponding to the address signal. The data input circuit receives the externally applied data signal and applies the same to the memory cell select circuit. The data output circuit receives data from the memory cell select circuit and externally outputs the same. The data input circuit and the data output circuit take in the data signal in response to rising and falling of the external clock signal and an external sub-clock signal having a phase shifted by a quarter of a cycle from the external clock signal.

According to yet another aspect of the invention, a method of writing data into a synchronous semiconductor memory device being operable continuously to take in an externally applied data signal in response to rising and falling of an external clock signal in an externally designated specific write mode, including the steps of:

writing a first data signal into an address corresponding to the externally applied address signal in response to the rising of the external clock signal; and inverting one of the bits in the address signal, and writing a second data signal formed by inverting the first data signal into a corresponding address in response to the falling of the external clock signal.

Accordingly, a primary advantage of the invention is to provide the synchronous semiconductor memory device, which can take in the input data at least two times during one cycle of the external clock signal, and can input/output data at a high frequency.

Another advantage of the invention is to provide a method of writing data, which can suppress loss in timing of change of the externally applied address signal and data signal, and can efficiently write test data into the synchronous semiconductor memory device.

The foregoing and other objects, features, aspects and advantages of the present invention will becomes more apparent from the following detailed description of the present invention when taken in conjunction with the accompanying drawings.

DESCRIPTION OF THE PREFERRED EMBODIMENTS

[Embodiment 1]

Figure 1:
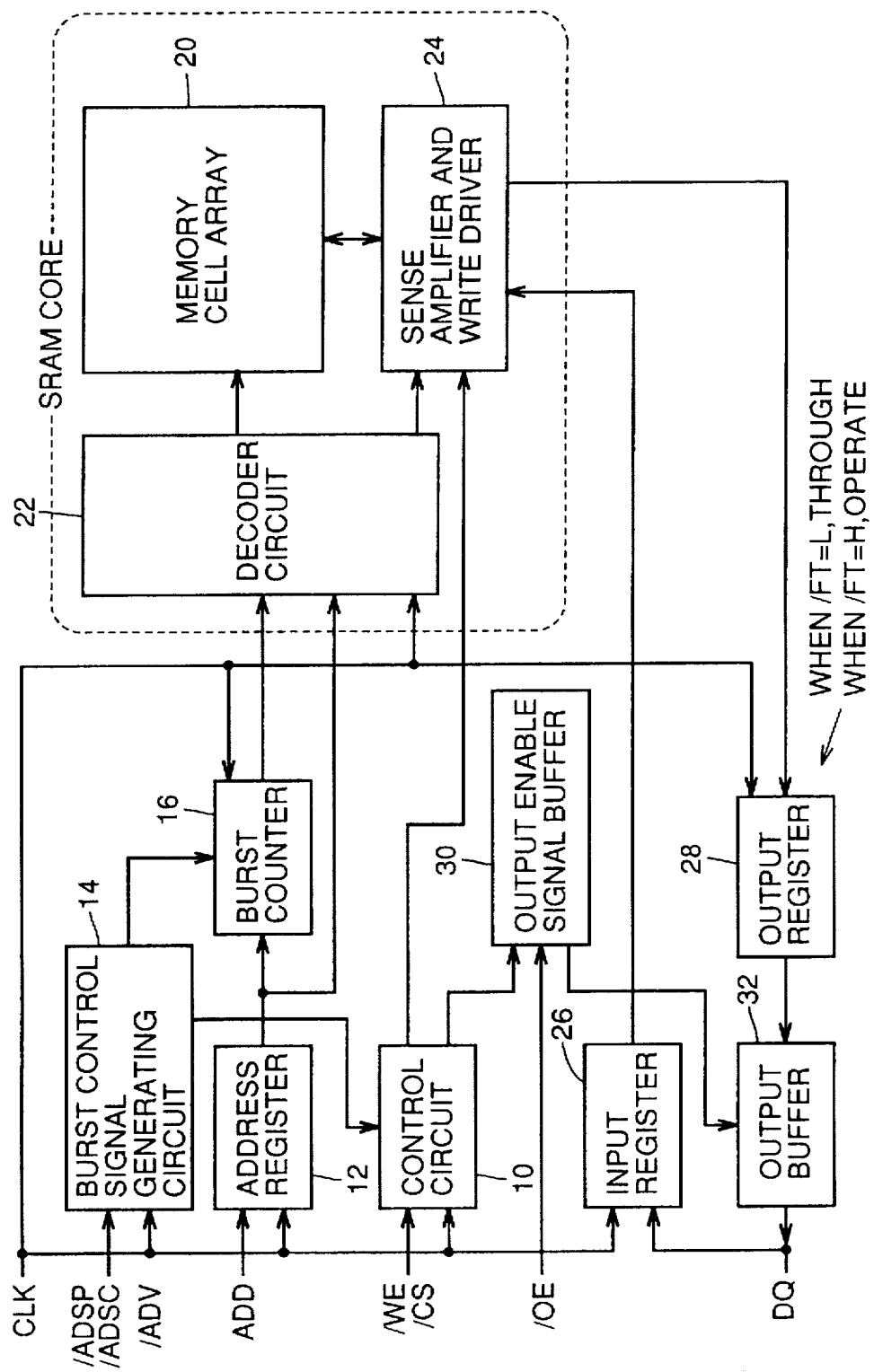
FIG. 1 is a schematic block diagram showing a structure of a synchronous SRAM 1000 of an embodiment 1 of the invention.

FIG. 1 is a schematic block diagram showing a structure of a synchronous SRAM 100 of an embodiment 1 of the invention.

Synchronous SRAM 100 includes a control circuit 10 which is controlled by an external clock signal CLK to receive a chip select signal /CS instructing activation of a chip and a write enable signal /WE enabling a write operation, an address register 12 which is controlled by signal CLK to take in an externally applied address signal, a burst control signal generating circuit 14 which is controlled by signal CLK to receive externally applied bust operation control signals /ADSP, /ADSC and /ADV, and control a burst operation mode, and a burst counter 16 which is controlled by burst control signal generating circuit 14 to issue an internal address during the burst operation mode.

Signal /ADSP is a control signal applied from a CPU (Central Processing Unit), and is taken into the circuit 14 at a rising edge of signal CLK. When signal /ADSP is at L-level, a burst operation is interrupted, and a new external address is latched. Signal /ADSC is a control signal applied from a memory controller, and is taken into the circuit 14 at the rising edge of signal CLK. When signal /ADSC is at L-level, the burst operation is interrupted, and a new external address is latched.

Signal /ADV is taken into the circuit 14 at the rising edge of signal CLK. When signal /ADV attains L-level, an internal burst counter is activated. When signal /ADV attains H-level, the internal burst counter stops its operation.

Synchronous SRAM 100 further includes a memory cell array 20 holding data, a decoder 22 which is controlled by signal CLK and selects a corresponding memory cell in accordance with an internal address signal applied from address register 12 via burst counter 16, and a sense amplifier and write driver circuit 24 which performs reading and writing of data from and into the memory cell selected by decoder 22.

Synchronous SRAM 100 further includes an input register 26 which is controlled by signal CLK to receive externally applied input data and apply the same to sense amplifier and write driver circuit 24, an output register 28 which is controlled by signal CLK and receives read data from sense amplifier and write driver circuit 24, an output enable signal buffer 30 which is controlled by control circuit 10 and an externally applied output enable signal /OE, and an output buffer 32 which is controlled by a signal sent from output enable signal 34 for externally issuing read data.

When signal /OE is at H-level, the output terminal attains a high impedance state.

Figure 2:
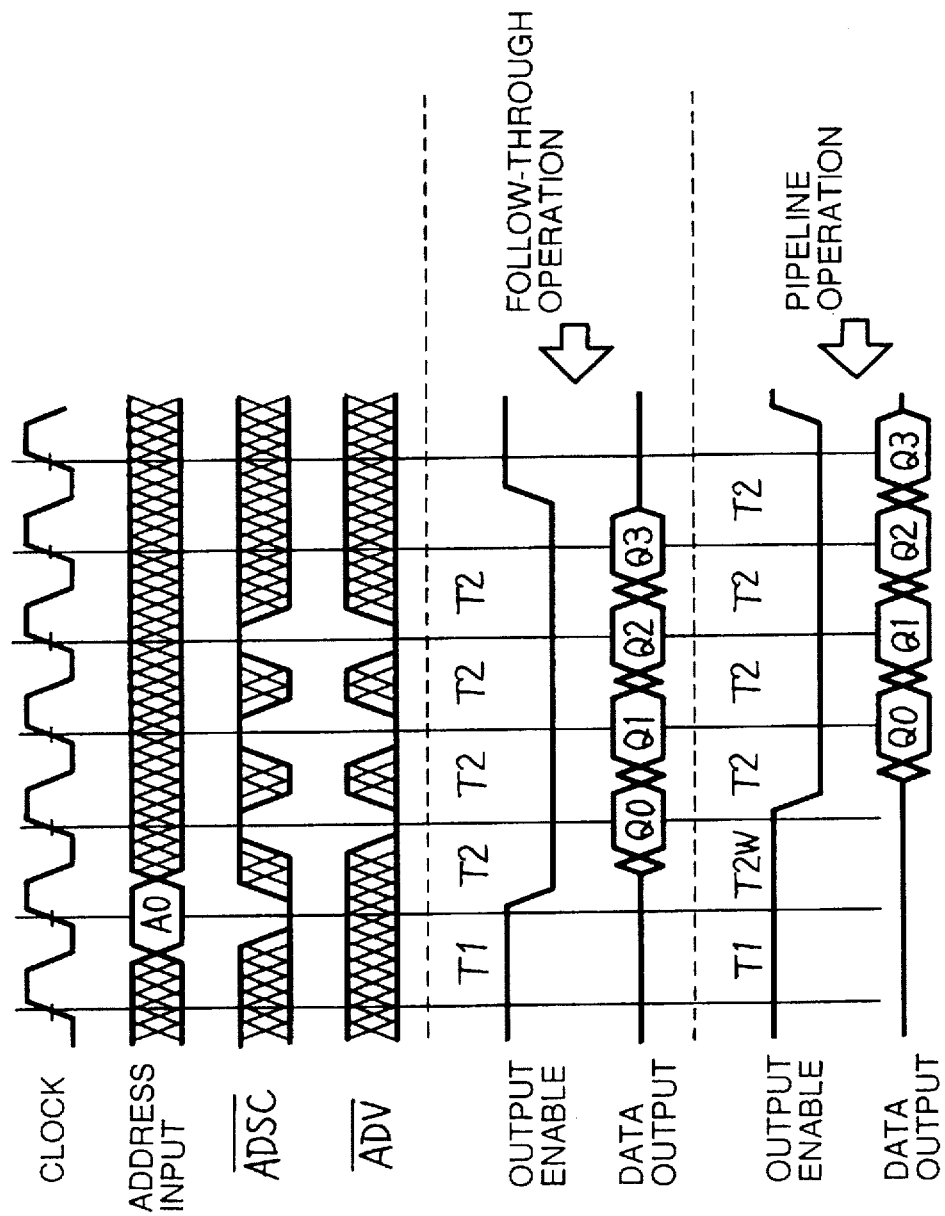
FIG. 2 is a timing chart showing a read operation of the synchronous SRAM.

FIG. 2 is a timing chart showing a read operation of synchronous SRAM 100 during burst transfer. During a cycle T1, address status signal /ADSC is enabled and hence attains L-level, and simultaneously an initial address A0 is taken into synchronous SRAM 100.

During a cycle T2, synchronous SRAM 100 operates to feed address A0 into address register 12, and starts a read operation. Decoder 22 selects a predetermined memory cell, and data which is read therefrom by sense amplifier and write driver circuit 24 is transmitted to output register 28. When follow-through-read is designated (i.e., when signal /FT is at L-level), output information is through-output via output buffer 32. Conversely, when signal /FT is at H-level, a pipeline read operation is designated, and read output information is temporally latched by output register 28. The data thus latched will be output in response to rising of the clock in the next cycle.

Therefore, access to the initial address for pipeline read requires a wait operation for one cycle. The clock access time, however, substantially depends on only a delay time of the output circuit. Therefore, rapid clock access is achieved.

When address advance signal /ADV is enabled (L-level) during this T2 (T2W) cycle, burst counter 16 in the memory will operate in the next cycle, and the internal address will automatically changes. In response to this address change, a new read operation will be performed.

All the operations described above are executed in response to the rising edges of externally applied clock signal CLK.

In the write operation, respective operations are likewise performed in response to the rising edges of clock signal CLK, although the timing itself of each control signal changes to designate the operation for writing.

According to the structure of the embodiment 1, the timings for input/output of data are varied in accordance with a test mode signal M1, and the write or read operation is performed in response to the rising or falling edge of clock signal CLK.

Figure 3:
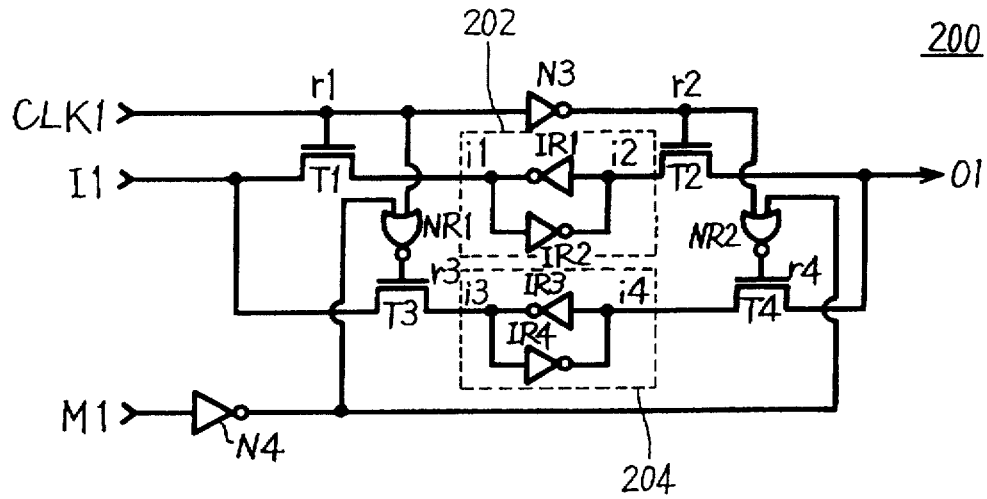
FIG. 3 is a circuit diagram showing a structure of an input control circuit 200 of the embodiment 1 of the invention.

FIG. 3 is a circuit diagram showing a structure of an input control circuit 200 of the embodiment 1.

Input control circuit 200 includes latch circuits 202 and 204 as well as an N-channel MOS transistor T1 which receives on its gate a clock signal CLK1 and is operable to send an applied input signal I1 to latch circuit 202, an inverter circuit N3 receiving clock signal CLK1, an N-channel MOS transistor T2 which receives on its gate an output of inverter circuit N3 and is operable to send an output of latch circuit 202 as an output signal O1 therefrom, an inverter circuit N4 which receives test mode control signal M1 as an input, an NOR circuit NR1 which receives an output of inverter circuit N4 and clock signal CLK1 as its inputs, an N-channel MOS transistor T3 which receives an output of NOR circuit NR1 on its gate and is operable to send an applied input signal I1 to latch circuit 204, an NOR circuit NR2 which receives an output of inverter circuit N3 and test mode control signal M1 as its inputs, and an N-channel MOS transistor T4 which receives on its gate an output of NOR circuit N2 and is operable to send an output of latch circuit 204 as signal O1 therefrom.

Latch circuit 202 includes inverter circuits IR1 and IR2 which have inputs connected to outputs of circuits IR2 and IR1, respectively. Latch circuit 204 includes inverter circuits IR3 and IR4 which have inputs connected to outputs of circuits IR4 and IR3, respectively.

Operation will now be described below.

The following description will be given on an operation in such a case that a test mode signal M1 is at H-level designating the test mode operation.

Figure 4:
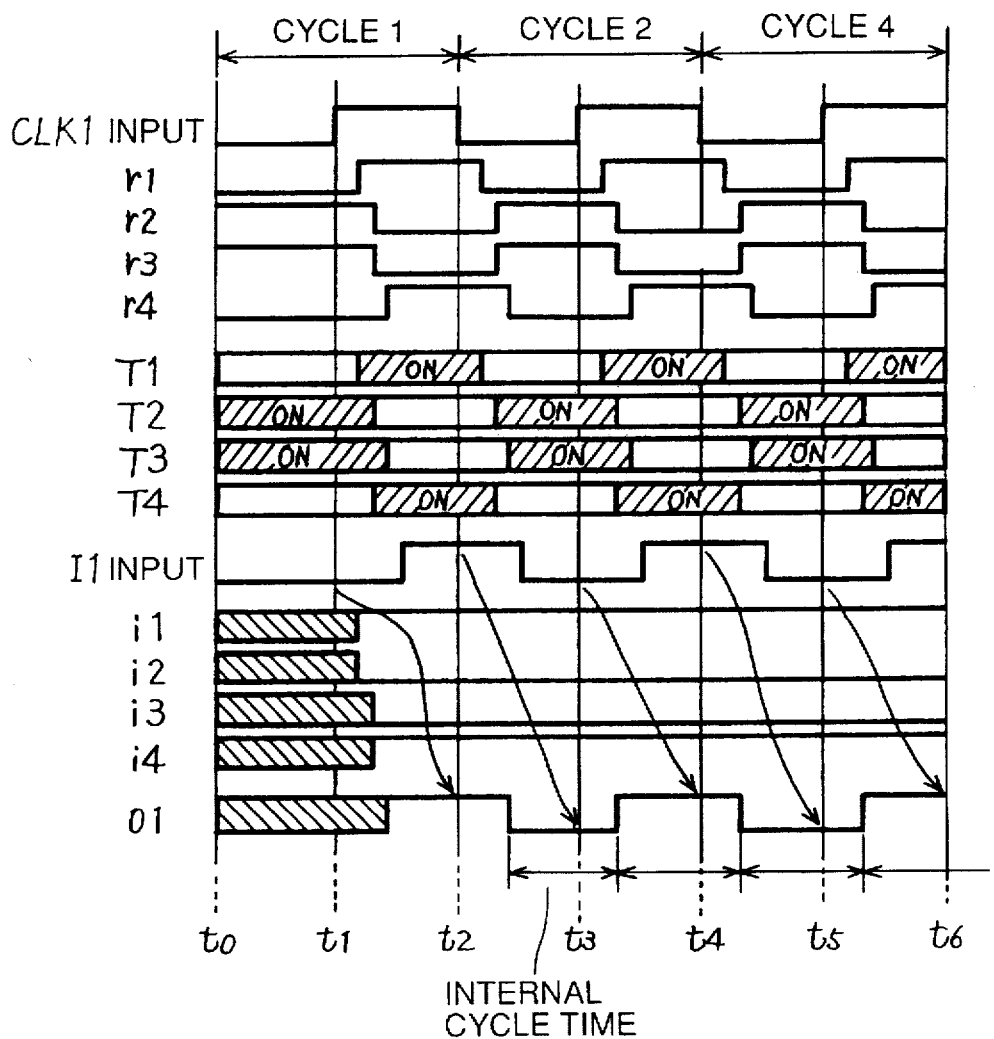
FIG. 4 is a timing chart showing an operation of the input control circuit 200.

FIG. 4 is a timing chart showing an operation of input control circuit 200.

It is assumed that clock signal CLK1 is at L-level at time t0, i.e., start of a cycle 1. At this time, N-channel MOS transistors T1 and T4 are off, and N-channel MOS transistors T2 and T4 are on.

Therefore, latch circuit 204 holds the level of input signal I1 at the rising edge of clock signal T1 during In response to rising of clock signal CLK1 at time t1, N-channel MOS transistors T1 and T4 are turned on, and transistors T2 and T3 are turned off.

At time t2, i.e., falling edge of clock signal CLK1 from which a cycle 2 starts, the level of output signal O1 attains H-level in accordance with the potential level of input signal I1 which latch circuit 204 took in at time t1. Thus, the input signal, which was taken in at the rising edge of clock signal CLK1 in cycle 1, is issued as an output signal at the falling edge of clock signal CLK1 in cycle 1. A time period from take-in of data to output is equal to a period between times t1 and t2, i.e., half of one cycle.

Subsequent operations are performed similarly. At time t2, i.e., falling edge of clock signal CLK1 in cycle 1, input signal I1 at H-level is taken into latch circuit 202, and will be issued as output signal O1 at time t3.

As described above, input control circuit 200 operates to execute take-in and output of data at both of the rising and falling edges of clock signal CLK 1. Therefore, the cycle of input/output of data is equal to a half of the cycle of external clock signal CLK1.

Within one cycle of the external clock signal, input signal I1 is taken in twice, so that the input or output of data can be executed at a double frequency.

Description has been given on the case where test mode control signal M1 is at H-level. When test mode control signal M1 is at L-level designating the normal operation, the outputs of both of AND circuits A1 and A2 are at L-level, so that transistors T3 and T4 are off. Input control circuit 200, therefore, attains a state similar to that of input control circuit 1000, and specifically only transistors T1 and T2 as well as inverter circuit N3 and latch circuit 202 are active. In the normal operation mode, therefore, input/output of data is performed correspondingly to one cycle of the external clock signal.

[Embodiment 2]

Figure 5:
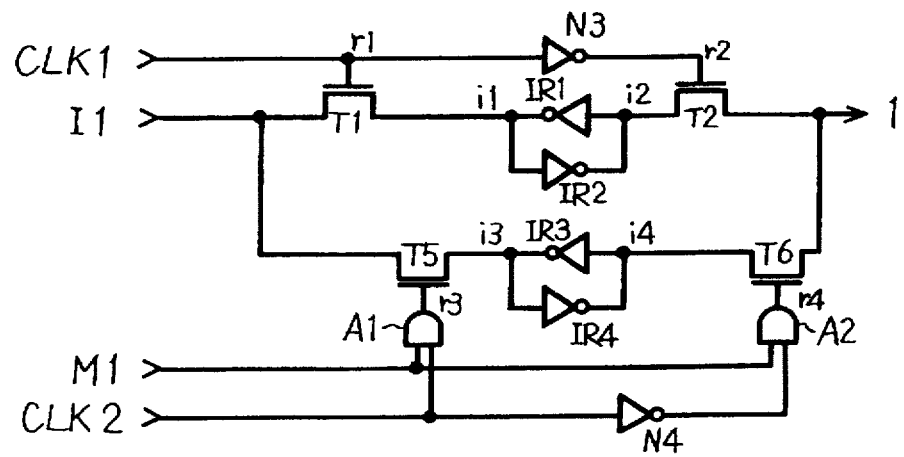
FIG. 5 is a circuit diagram showing a structure of an input control circuit 300 of an embodiment 2 of the invention.

FIG. 5 is a circuit diagram showing a structure of an input control circuit 300 of an embodiment 2 of the invention.

Input control circuit 300 differs from input control circuit 200 of the embodiment 1 in that N-channel MOS transistors T5 and T6 are controlled by a sub-clock signal CLK2 and test mode signal M1.

N-channel MOS transistor T5 receives on it gate the output of AND circuit A1 receiving signals M1 and CLK2. N-channel MOS transistor T6 receives on its gate the output of AND circuit A2 which receives a signal produced by inverting signal CLK2 by an inverter circuit N4 and test mode control signal M1.

It is assumed that clock signal CLK2 varies complementarily to clock signal CLK1.

Figure 6:
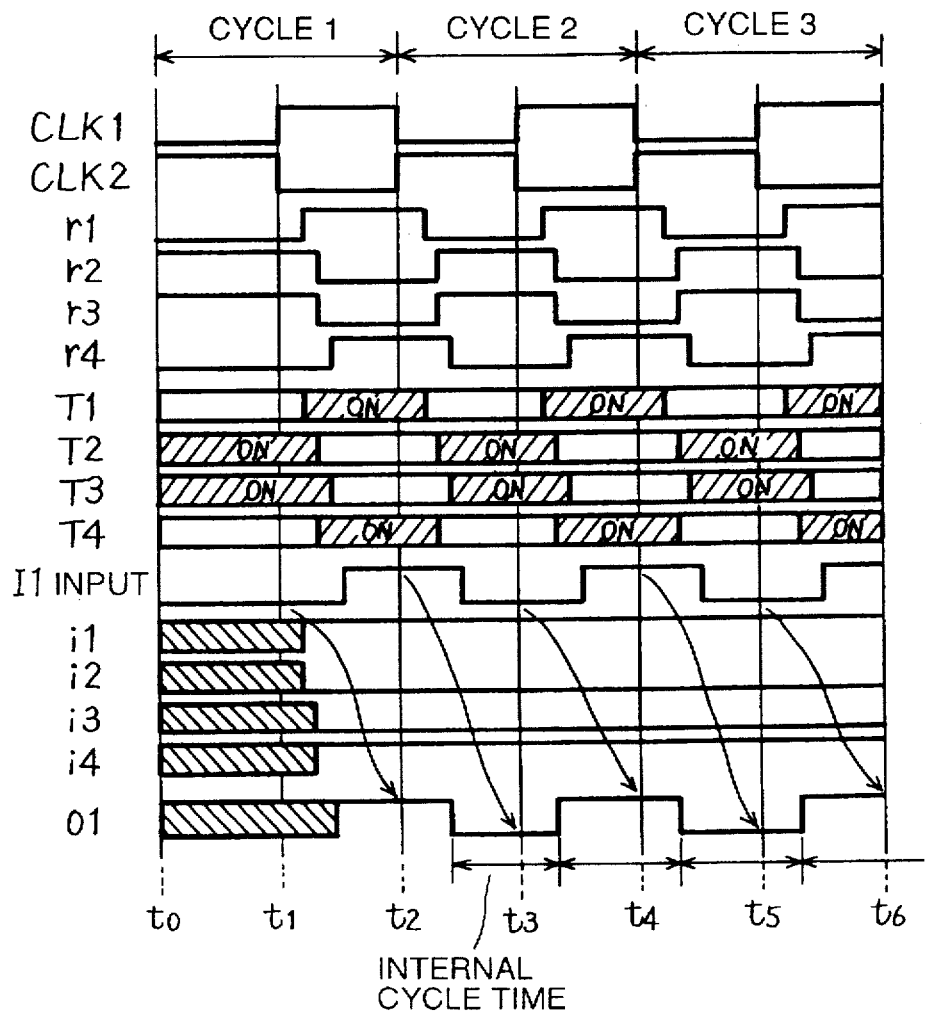
FIG. 6 is a timing chart showing an operation of the input control circuit 300.

FIG. 6 is a timing chart showing an operation of input control circuit 300 shown in FIG. 5.

The operation is basically similar to that of input control circuit 200 of the embodiment 1 except for that clock signals CLK1 and CLK2 are used as externally applied clock signals.

Input control circuit 200 of the embodiment 1 performs control using clock signal CLK1 and inverted clock signal /CLK1 which is produced by inverting clock signal CLK1 by inverter circuit N3. Meanwhile, in the embodiment 2, the control is performed using two complementary clock signals CLK1 and CLK2.

Similarly to the foregoing embodiment, the signal which was taken in at time t1 is issued at time t2, and the signal which is taken in at time t2 will be issued at time t3. Therefore, a time required between take-in and output of data is equal to a half of the cycle of the clock signal, and the input control circuit of the embodiment 2 achieves an effect similar to that by the input control circuit of the embodiment 1.

Since the embodiment 2 uses complementary clock signals CLK1 and CLK2, it is not restricted to the structure shown in FIG. 5, and, for example, such a structure may be employed that clock signal CLK2 is applied to the gate of N-channel MOS transistor T2, and the test mode control signal and clock signal CLK1 are applied to AND gate A2.

[Embodiment 3]

Figure 7:
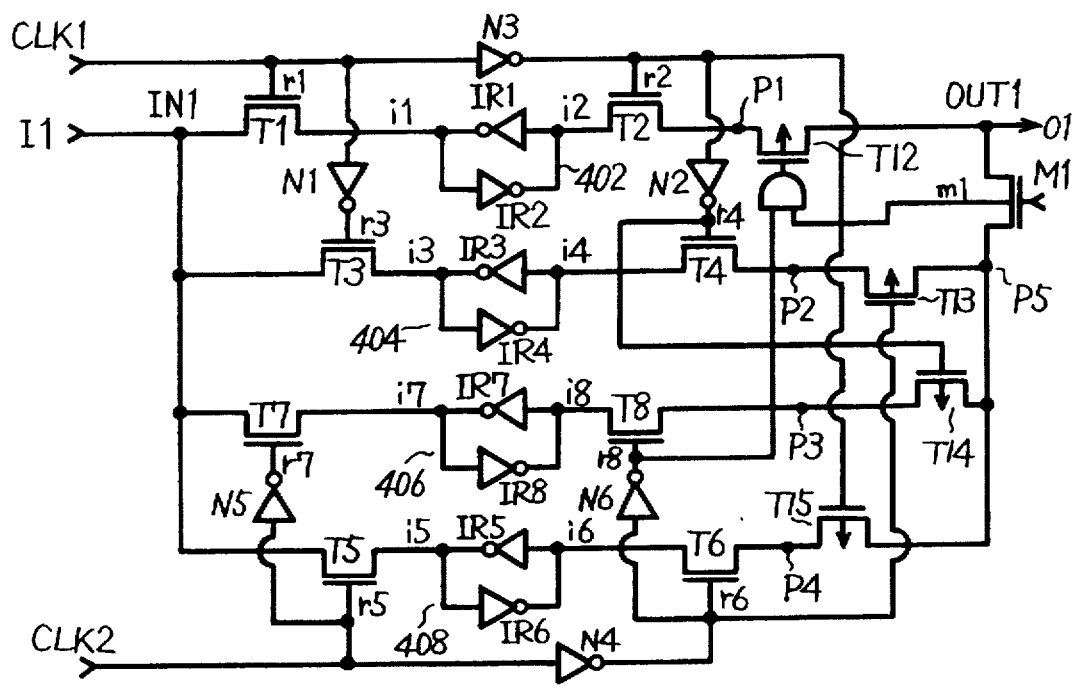
FIG. 7 is a circuit diagram showing a structure of an input control circuit 400 of an embodiment 3 of the invention.

FIG. 7 is a circuit diagram of an input control circuit 400 of an embodiment 3 of the invention.

Input control circuit 400 of the embodiment 3 primarily differs from input circuit 300 of the embodiment 2 in the following two points.

First, clock signals CLK1 and CLK2 which control the operation of input control circuit 400 are not complementary to each other in contrast to the embodiment 2, and have phases which are shifted from each other by a quarter of the cycle.

Second, input control circuit 400 has four latch circuits each holding input data, whereby take-in and output of data can be performed four times during one cycle of external clock signal CLK1, as will be described below.

Input control circuit 400 of the embodiment 3 includes latch circuits 402, 404, 406 and 408 as well as N-channel MOS transistor T1 which is connected between an input node IN1 and an input of latch circuit 402, and receives clock signal CLK1 on its gate, an inverter circuit N3 which receives clock signal CLK1, N-channel MOS transistor T2 which is connected between a node P1 and an output of latch circuit 402, and receives on its gate an output of inverter circuit N3, an inverter circuit N4 which receives clock signal CLK2, an inverter circuit N6 which receives an output of inverter circuit N4, an AND circuit 410 which receives an output of inverter circuit N6 and test mode control signal M1, a P-channel MOS transistor T12 which is connected between node P1 and an output node OUT1, and receives on its gate an output of AND circuit 410, an inverter circuit N1 which receives clock signal CLK1, N-channel MOS transistor T3 which is connected between input node IN1 and the input of latch circuit 404, and receives on its gate an output of inverter circuit N1, an inverter circuit N2 which receives an output of inverter circuit N3, N-channel MOS transistor T4 which is connected between an output of latch circuit 404 and a node P2, and receives on its gate an output of inverter circuit N2, a P-channel MOS transistor T13 which is connected between nodes P2 and P5, and receives on its gate an output of inverter circuit N4, an N-channel MOS transistor N10 which is connected between node P5 and output node OUT1, and receives test mode control signal M1 on its gate.

Input control circuit 400 further includes inverter circuit N5 which receives clock signal CLK2, an N-channel MOS transistor T7 which is connected between input node IN1 and an input of latch circuit 406, and receives on its gate an output of inverter circuit N5, an N-channel MOS transistor T8 which is connected between an output of latch circuit 406 and a node P3, and receives on its gate the output of inverter circuit N6, a P-channel MOS transistor T14 which is connected between nodes P3 and P5, and receives on its gate the output of inverter circuit N2, N-channel MOS transistor T5 which is connected between input node IN1 and latch circuit 408, and receives clock signal CLK2 on its gate, N-channel MOS transistor T6 which is connected between an output of latch circuit 408 and node P4, and receives on its gate an output of inverter circuit N4, and a P-channel MOS transistor T15 which is connected between nodes P4 and P5, and receives on its gate the output of inverter circuit N3.

Operation of input control circuit 400 will be described below.

Figure 8:
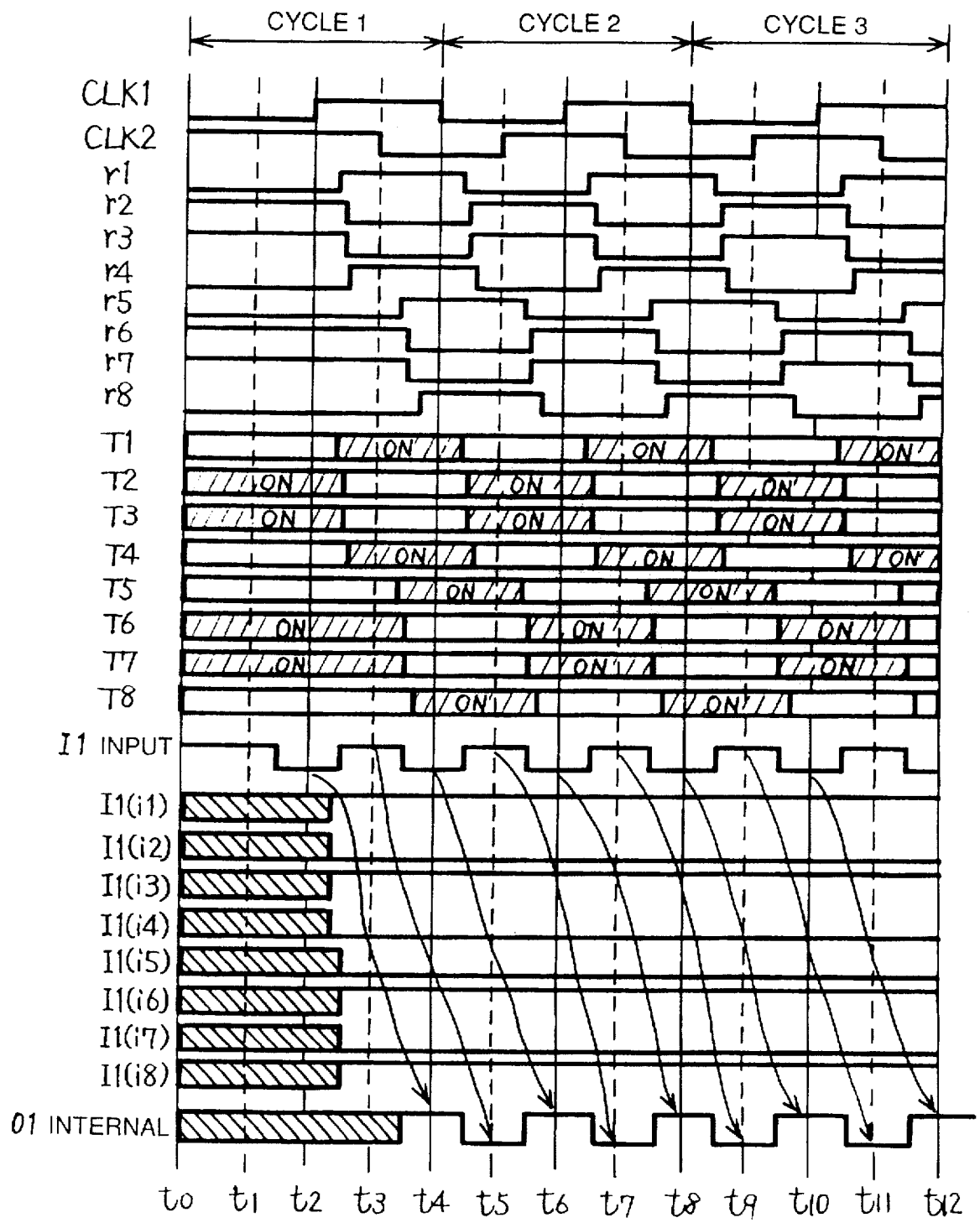
FIG. 8 is a timing chart showing an operation of the input control circuit 400.

FIG. 8 is a timing chart showing an operation of input control circuit 400.

At time t0, clock signal CLK1 is at L-level, and clock signal CLK2 is at H-level.

Therefore, transistors T2, T3, T6 and T7 are on, and transistors T1, T4, T5 and T8 are off.

It is assumed that input signal I1 is at L-level at time t2, i.e., at the center in cycle 1. At this time, clock signal CLK1 rises to H-level, and clock signal CLK2 maintains H-level. Therefore, the potential levels of these input signals are taken into latch circuits 404 and 406 via on transistors T3 and T7, respectively.

In response to change of clock signal CLK1 at time t2, transistors T1 and T4 are turned on, and transistors T2 and T3 are turned off.

It is assumed that input signal I1 has changed its Level into H-level at time t3, i.e., when three quarters of cycle 1 elapses. The level of this input signal is taken into latch circuits 402 and 406 via on transistors T1 and T7, respectively. Therefore, the potential level held by latch circuit 406 changes from L-level of the input signal at time t2 into H-level which is the level of input signal at time t3.

At time t3, clock signal CLK2 rises to L-level. In response to this, transistors T5 and T8 are turned on, and transistors T6 and T7 are turned off.

At time t4, i.e., upon completion of cycle 1, the input signal which was taken into latch circuit 404 via transistor T3 at time t2 is sent to node P2 in response to turn-on of transistor T4. At this time, the output level of inverter circuit N4 which is equal to the gate potential of transistor T13, i.e., the output level of a node r6 is at L-level, and transistor T13 is on, so that the potential level of node P2 is transmitted to node P5. Further, the test mode signal is at H-level, so that the potential level of node P5 is transmitted to output node OUT1 and is issued as signal O1.

At this time, the level of gate potential of transistor T12, i.e., the output level of inverter circuit N6 (potential level of a node r8) is at L-level, and transistor T12 is on. However, transistor T2 is off. Therefore, the potential level held by latch circuit 402 does not affect output node OUT1. The potential level of gate of transistor T14, i.e., the output potential of inverter circuit N2 (potential level of a node r4) is at H-level at time t4, so that transistor T14 is off, and the potential level held by latch circuit 406 does not affect output node OUT1. Further, the input potential applied to the gate of transistor T6, i.e., the output level of inverter circuit N4 (potential level of node r6) is at L-level at time t4, so that transistor T6 is off, and the potential level held by latch circuit 408 does not affect output node OUT1.

In this manner, data which was taken into input control circuit 400 at time t2 is issued to output node OUT1 at time t4, i.e., after half a cycle.

Likewise, the input signal which was taken into input control circuit 400 at time t3 is issued at time t5, i.e., after half a cycle. Thereafter, operations are performed similarly, so that the input signals taken into the circuit at the rising or falling edge of clock signal CLK1 or CLK2 are successively issued to the output node after elapsing of half a cycle. Therefore, take-in of data is performed four time during one cycle, and output of data is also performed four times during one cycle, because one cycle contains four rising edges and four falling edges of clock signals CLK1 and CLK2.

Input control circuit 400 of the embodiment 3 is controlled by clock signal CLK1 and clock signal CLK2 which is shifted from clock signal CLK1 by a quarter of the cycle, and can take in data at a frequency 4 times larger than that of conventional input control circuit 1000.

In the operation described above, take-in of data is performed at a quadrupled frequency using clock signal CLK1 and clock signal CLK2 shifted therefrom by a quarter of the cycle. Naturally, the cycle of each clock signal may be reduced, e.g., to a half, whereby take-in of data can be performed at a frequency which is eight times larger than that described above. More generally, the times of input/output of data can be increased to $2^n$-fold (n: natural number) within a constant period.

[Embodiment 4]

Figure 9:
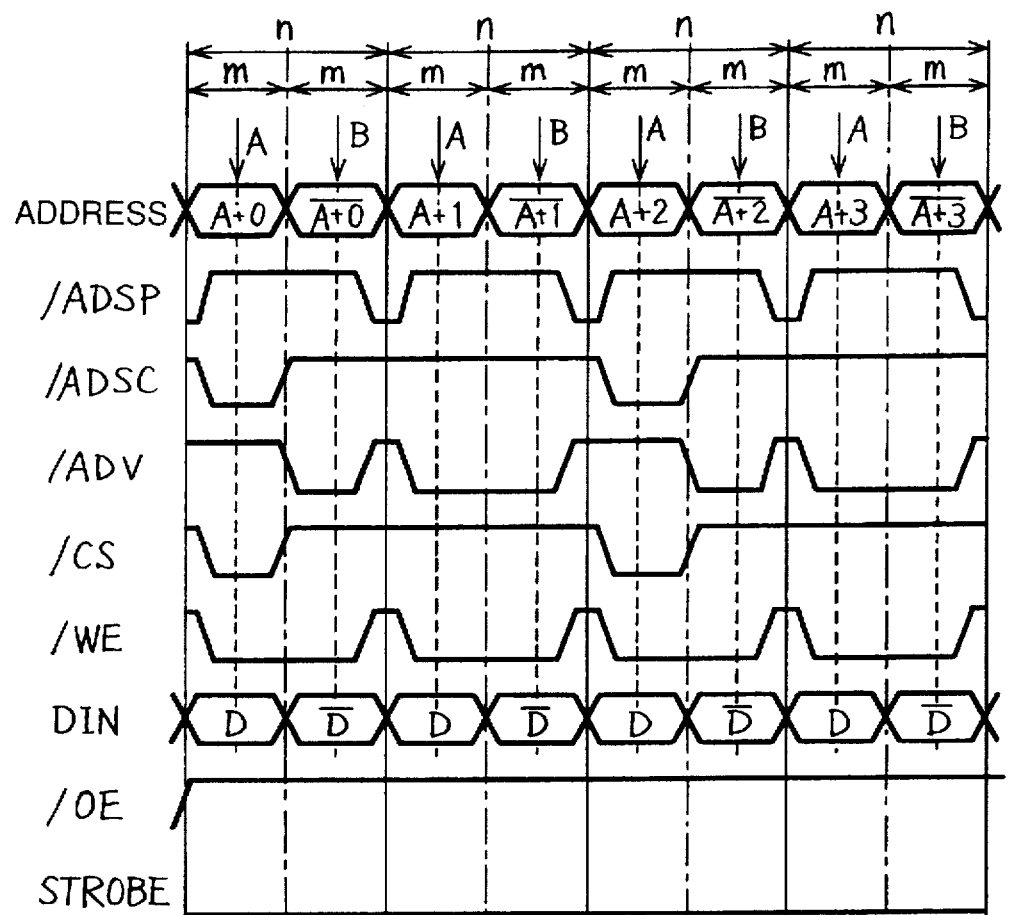
FIG. 9 is a timing chart showing a test pattern for writing in a burst operation of an embodiment 4 of the invention.

FIG. 9 is a timing chart showing a test pattern during 4-bit burst writing, and particularly in the case where a synchronous SRAM operates at double the frequency of clock supplied from a tester.

In the first cycle, signal /ADSC attains L-level at a take-in position A, so that a start address $A_0$ for the burst operation is taken in. At a second take-in position in the first cycle, signal /ADV attains L-level, so that a burst counter in the synchronous SRAM operates one time. Similarly, signal /ADV attains or maintains L-level at each of the take-in positions A and B in the second cycle, so that the burst counter operates two times. The operations in the first and second cycles are repeated in the third and fourth cycles. During these operations, an input signal DIN is taken at respective take-in positions by setting signal /WE to L-level. The input signals thus taken are successively written into addresses determined by the burst counter.

Input signal DIN is set such that data at take-in position A is equal to inverted data of data at second take-in position B, whereby it is possible to prevent continuous writing of the same data at successive addresses. In this manner, writing by the burst operation can be performed at double the clock frequency set by the tester without a loss.

Figure 10:
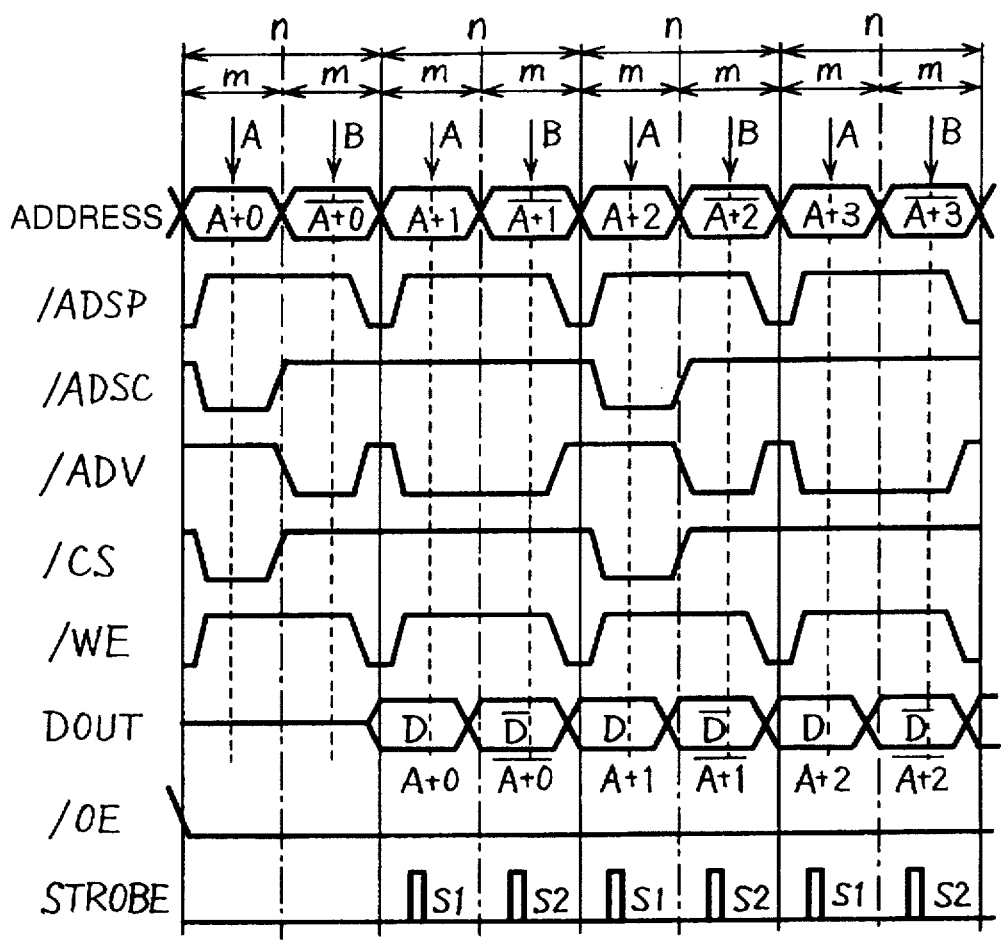
FIG. 10 is a timing chart showing a test pattern for reading and corresponding to that in FIG. 9.

FIG. 10 is a timing chart showing a test pattern in the 4-bit burst operation, and particularly during reading of the written data in FIG. 9, which is performed in a synchronous SRAM operating at double the frequency of clock supplied from the tester.

Similarly to FIG. 9, signal /ADSC attains L-level at take-in position A in the first cycle, so that the start address for the burst operation is taken in. At the second take-in position B in the first cycle, signal /ADV is set to L-level, so that the burst counter operates one time.

Similarly, signal /ADV attains or maintains L-level at take-in positions A and B in the second cycle, so that the burst counter operates two times in total. The operations in the first and second cycle are repeated in the third and fourth cycles.

Signal /WE is set to H-level, and signal /OE is set to L-level, so that the read operation is designated, and data is read from the address, which is taken at take-in position A in the first cycle, and an address which is determined by the burst counter based on the address taken at take-in position A in the first cycle.

In the above operation, data is output two times in one cycle. Therefore, such a structure is employed that the tester issues a strobe pulse two times in one cycle. In accordance with the strobe pulse, the tester takes in a data value, and comparison between the read data value and the expected value is performed two times in one cycle.

In this manner, the reading by the burst operation and the test for the same can be performed at double the frequency of the clock signal applied from the tester without a loss.

[Embodiment 5]

Figure 11:
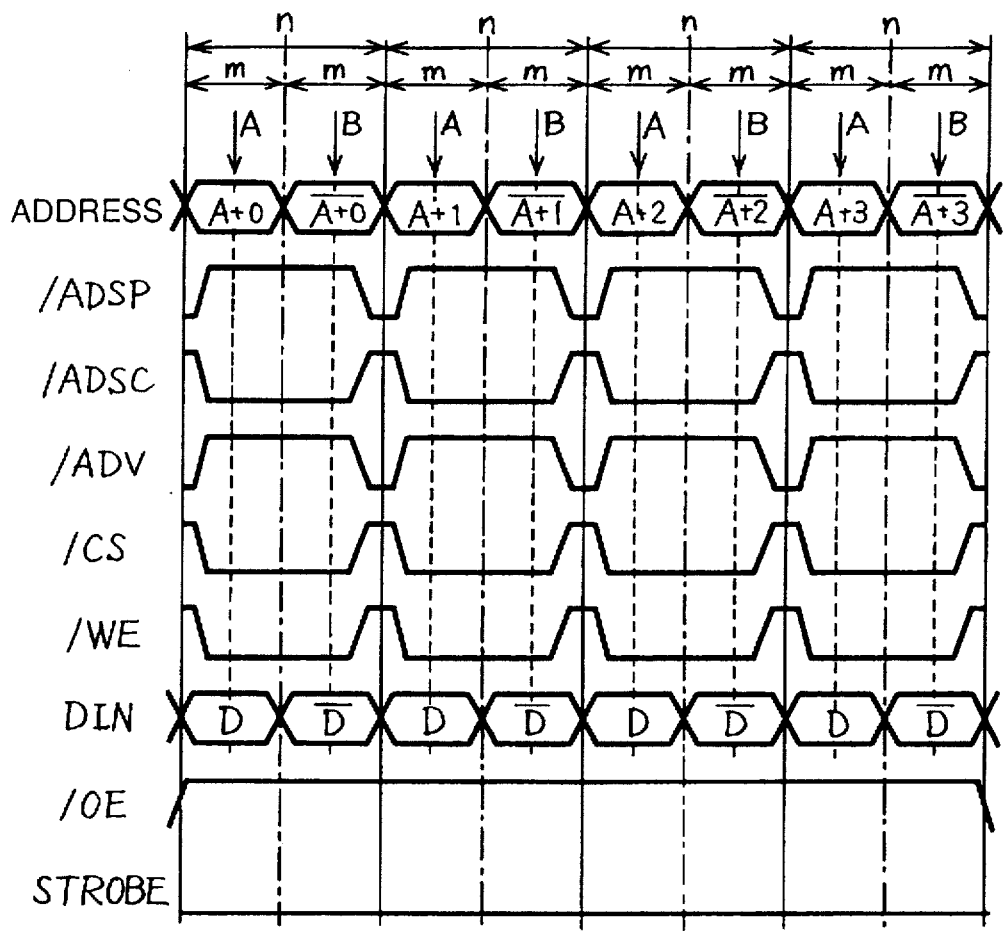
FIG. 11 is a timing chart showing a test pattern for writing in a normal operation of an embodiment 5 of the invention.

FIG. 11 is a timing chart showing a test pattern for a normal write operation in the synchronous SRAM which operates at double the frequency of the clock signal applied from the tester.

An address for starting the writing is taken in at take-in position A in the first cycle. At second take-in position B in the first cycle, an inverted address of the address taken in at take-in position A is issued from the tester to the synchronous SRAM.

The above address change is repeated in the second, third and fourth cycles in a similar manner.

During the above operations, the write operation is designated by setting signal /WE to L-level, so that data of signal DIN which were taken in at the respective take-in positions are successively written into the memory cells corresponding to the data of address signal which are taken in at the subsequent data-take-in positions. Input signal DIN is set such that the data of signal DIN taken in at take-in position A is equal to inverted data of the data taken in at second take-in position B, whereby it is possible to prevent continuous writing of the same data at successive addresses.

In this manner, writing of data in the normal operation can be performed at double the frequency of the clock signal supplied from the tester without a loss.

Figure 12:
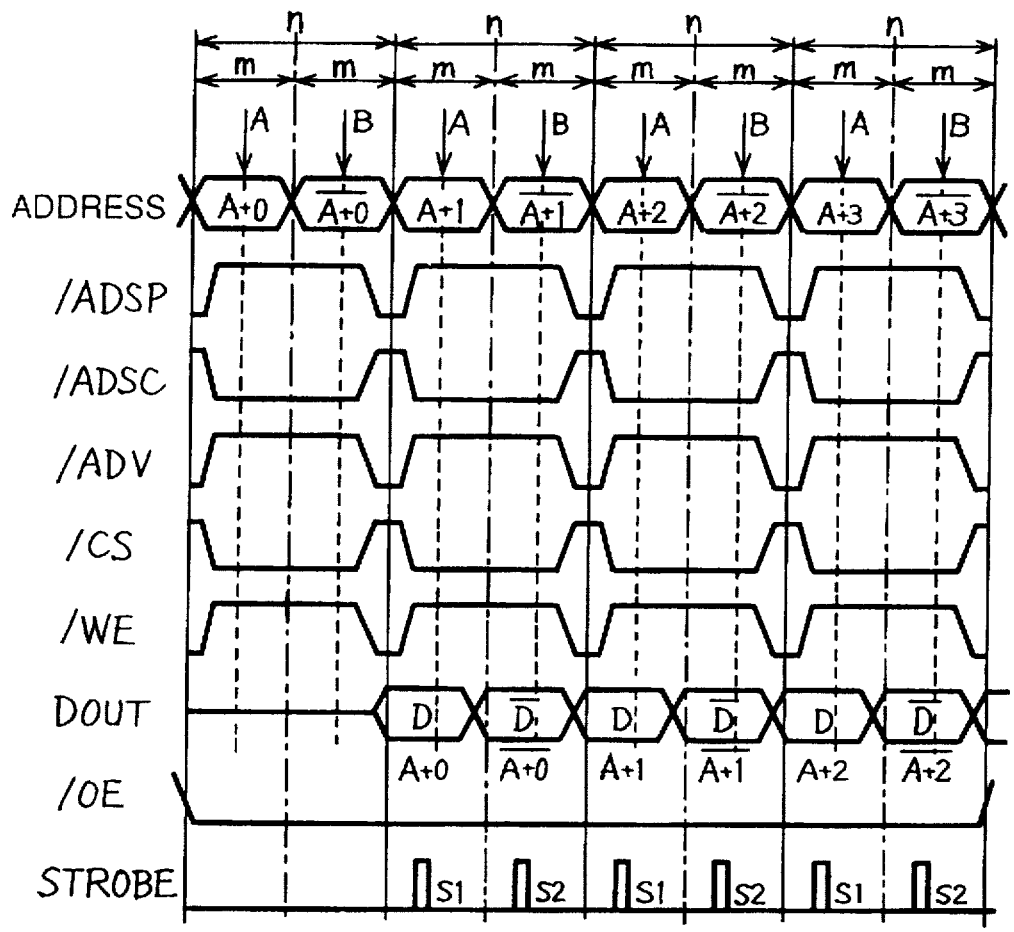
FIG. 12 is a timing chart showing a test pattern for reading and corresponding to FIG. 11.

FIG. 12 is a timing chart showing a test pattern for reading the written data shown in FIG. 11 by the normal read operation, which is performed at double the frequency of the clock signal applied from the tester.

Similarly to FIG. 11, the address is taken in at take-in position A in the first cycle. At second take-in position B in the first cycle, the address designated at take-in position A and the inverted address signal are applied to the synchronous SRAM. The operations performed in the first cycle are repeated in the second, third and fourth cycles.

During the above operations, signal /WE is set to H-level, and signal /OE is set to L-level, so that the read operation is designated, and data is read from the addresses which were taken at the respective take-in positions.

In the above read operation, data is output two times in one cycle. Therefore, the tester is adapted to issue a strobe pulse two times in one cycle, whereby data at the time of H-level of this strobe signal is inverted. By making comparison with respect to the expected value applied in the write operation, the reading and testing in the normal operation can be performed without a loss even at double the frequency of the clock signal applied from the tester as described above.

[Embodiment 6]

Figure 13:
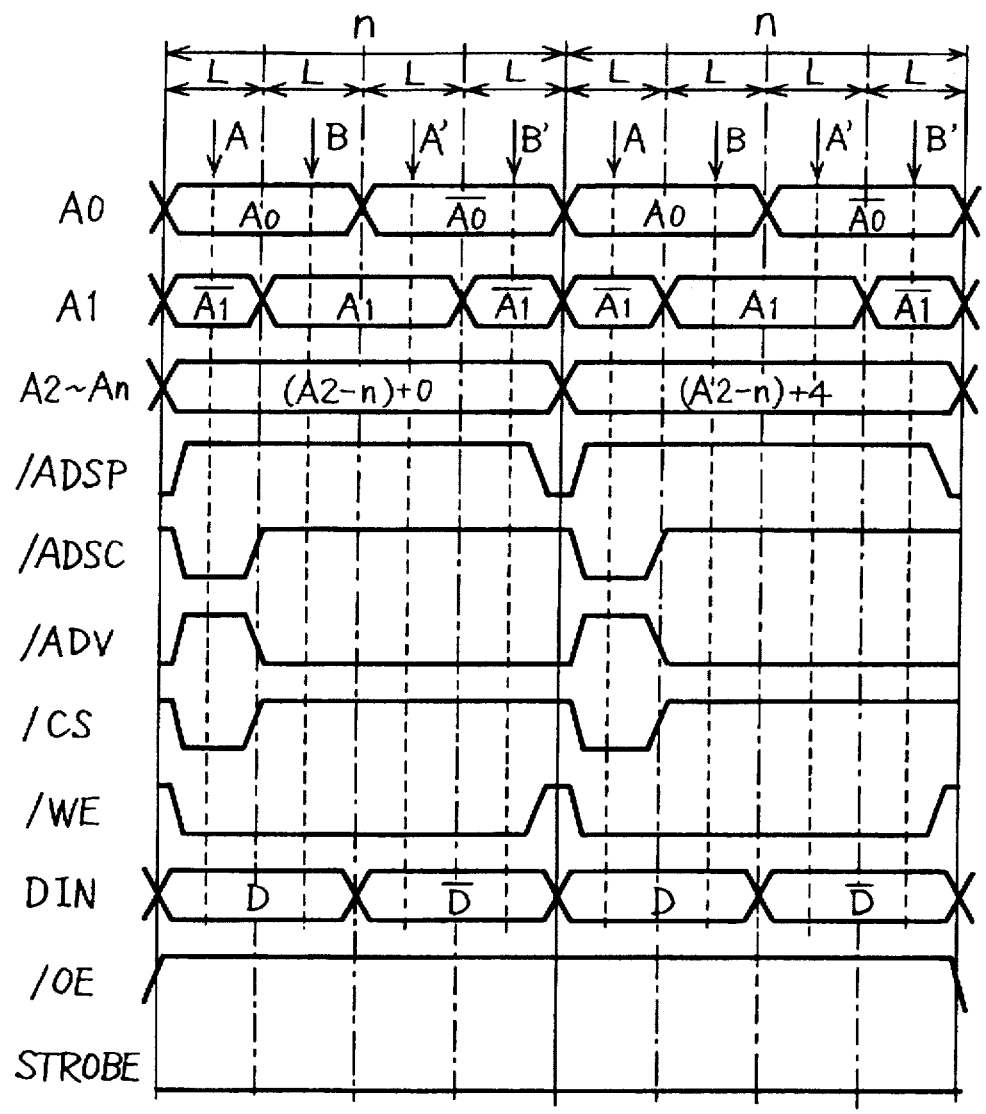
FIG. 13 is a timing chart showing a test pattern for writing in a burst operation of an embodiment 6 of the invention.

FIG. 13 is a timing chart showing a test pattern for writing in a 4-bit burst operation, and particularly in the case where the synchronous SRAM operates at a frequency four time larger than that of the clock signal supplied from the tester.

At take-in position A in the first cycle, signal /ADSC attains L-level, so that a start address for the burst operation is taken in. Signal /ADV attains L-level at second, third and fourth take-in positions B, A' and B' in the first cycle, whereby the burst counter operates three times in total. The above operations in the first cycle are repeated in the second cycle.

During the above operations, signal /WE is set to L-level to designate the write operation, and, in one cycle, input signal DIN is switched to an inverted level at half the cycle.

In the address signal at the tester, the lowest bit is inverted at every half cycle, and the second bit is inverted at every half cycle with a delay of a quarter of the cycle from inversion of the lowest bit. Contents of the bits at third and higher digits are renewed at every cycle.

The address at which data is actually written in the synchronous SRAM is the address which the burst counter determines by counting up from the address taken at the first take-in position in the first cycle. In the tester part, the address changes regardless of the address for the actual writing, and a correspondence or relationship between the write data and the address value is stored.

According to the above manner of changing the address, the actual write address itself changes the contents of its bits at every quarter cycle, but the address to be stored by the tester part is required to change only at every half or more cycle. Therefore, a load at the tester part can be minimized even in a rapid test operation.

Noncoincidence between the address, at which writing was actually performed, and the address stored at the tester part can be handled as if data were written at the address stored at the tester part, if a read operation is performed in such a manner that the address signal in the tester part is changed in the completely same manner as the write operation.

By the operations described above, continuous writing of four successive bits can be performed without a loss even in the case where writing in the synchronous SRAM is performed by the burst operation at a frequency four time larger than that of the clock signal supplied from the tester.

Figure 14:
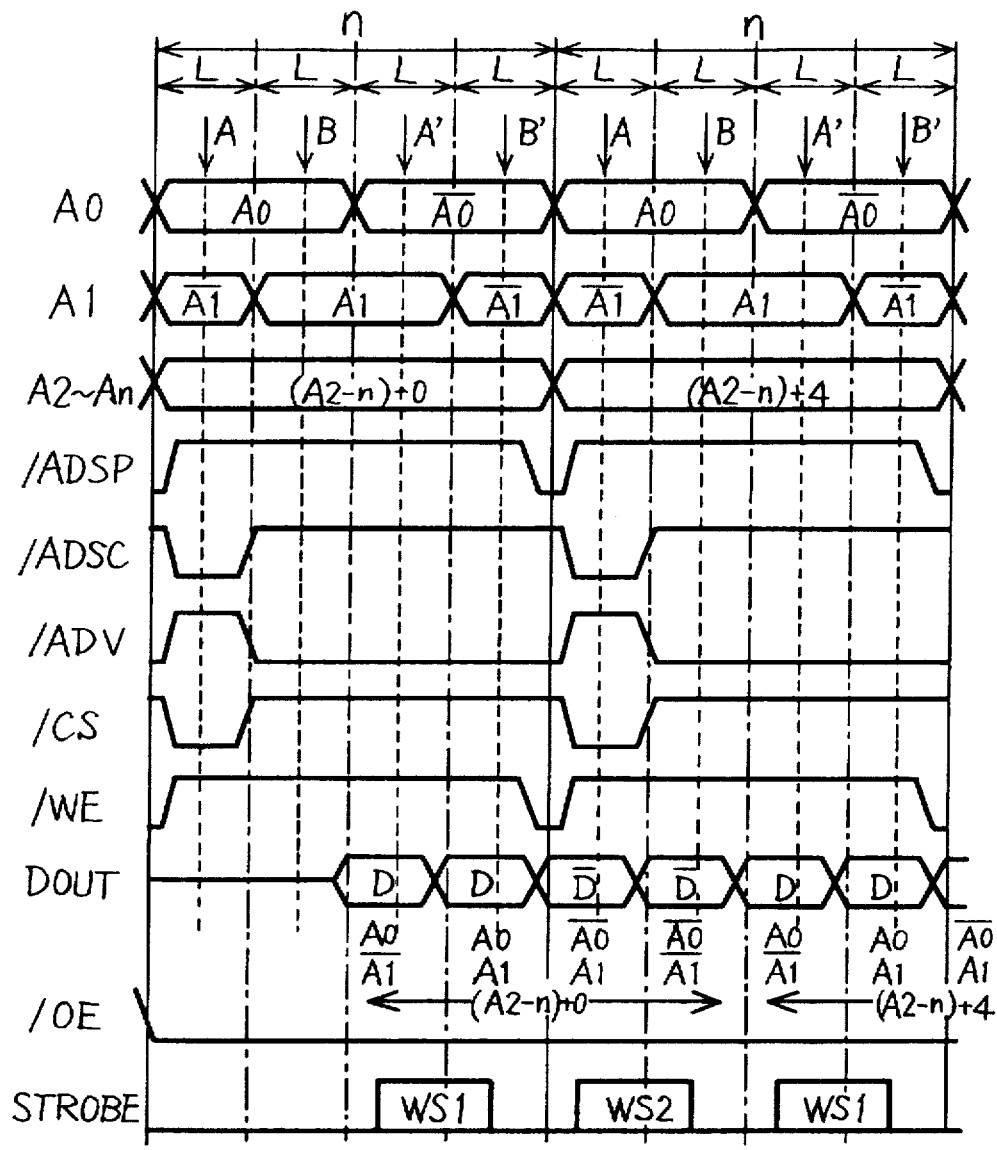
FIG. 14 is a timing chart showing a test pattern for reading and corresponding to FIG. 13.

FIG. 14 is a timing chart showing a test pattern in the 4-bit burst operation for reading the written data in FIG. 13 at a frequency four time larger than that of the clock signal supplied from the tester.

Similarly to the operations in FIG. 13, signal /ADSC attains L-level at first take-in position A in the first cycle, so that the start address for the burst operation is taken in. Signal /ADV maintains L-level at the second, third and fourth take-in positions B, A' and B' in the first cycle, so that the burst counter performs count-up three times.

The above operations in the first cycle are repeated in the second cycle.

In the above operations, signal /WE is set to H-level, and signal /OE is set to L-level, whereby the read operation is designated, and data is read from the address, which was taken in at the first take-in position in the first cycle, and the address depending on the count of the burst counter. Although data output is performed four times in one cycle, the output data corresponding to the first and second take-in positions A and B are the same data (D), and the output data corresponding to the third and fourth take-in positions A' and B' are the same data (/D), as is apparent from the write operation in FIG. 13. Therefore, the same data are successively output for each group containing two continuous bits, so that it is not necessary to output a strobe pulse from the tester at every quarter of the cycle. By outputting the window strobe signal, for example, extending over third and fourth quarters of the cycle as shown in FIG. 14, it is possible to make comparison with respect to an expected value by detecting only that output data does not change during the H-level of the window strobe signal. Similarly, the tester issues a window strobe signal WS2 extending over first and second quarters of the second cycle, whereby it is possible to make comparison between the read data and the expected value by detecting that output data does not change while window strobe signal WS2 is at H-level.

In this read operation, and particularly even in connection with the burst operation in which 4-bit data are successively read at a frequency four times larger than that of the clock signal applied from the test, it is required for the tester part to compare the read data with the expected value in accordance with the window strobe signal issued at every half cycle. Therefore, a load on the tester can be reduced. Accordingly, the read operation and test for the 4-bit burst operation can be performed without a loss.

[Embodiment 7]

Figure 15:
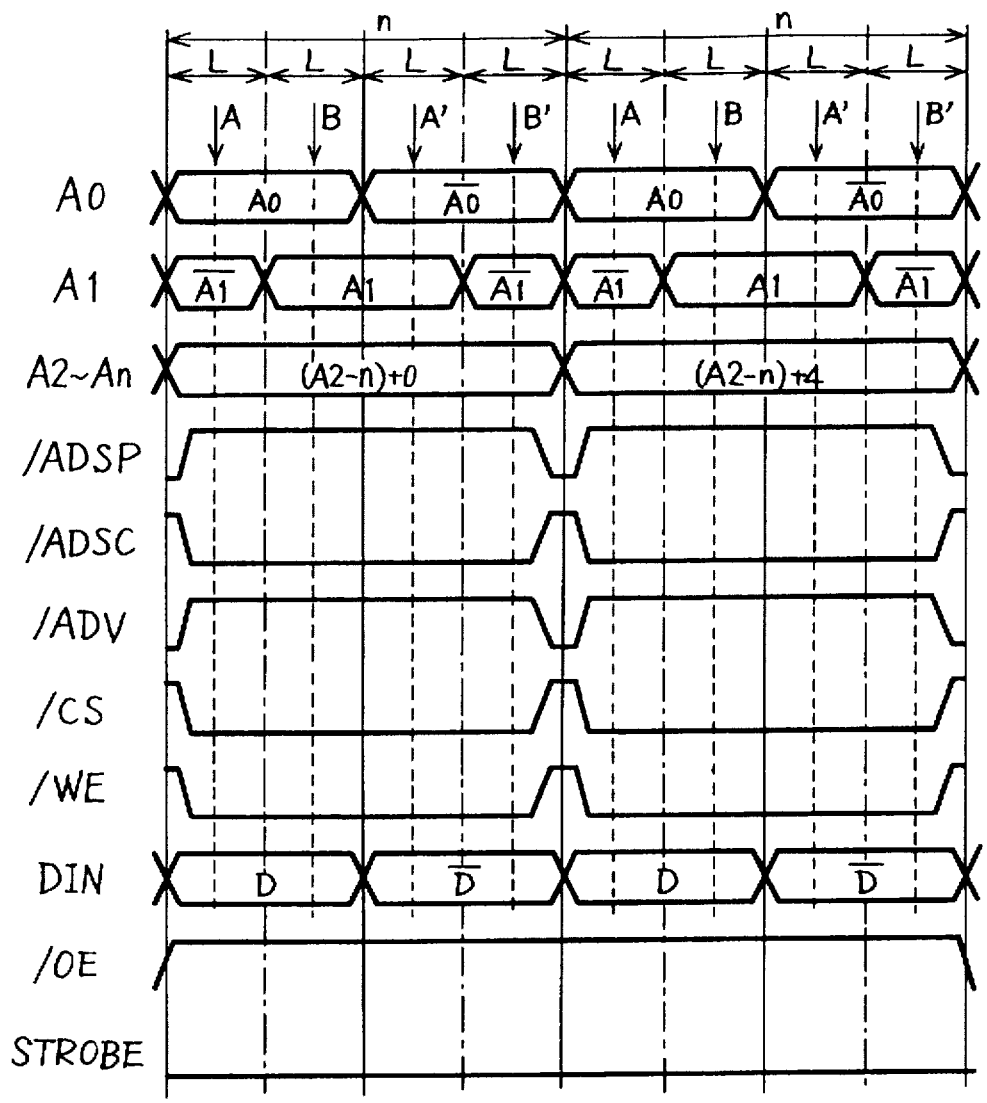
FIG. 15 is a timing chart showing a test pattern for writing in a normal operation of an embodiment 7 of the invention.

FIG. 15 is a timing chart showing a test pattern for the normal write operation in the synchronous SRAM, which operates at a frequency four times larger than the frequency of signal applied from the tester.

During the first cycle, the address signal is taken in four times at take-in position A as well as second, third and fourth take-in positions B, A' and B'. In the address signal applied from the tester during this, the value of the lowest bit, i.e., A0 address is inverted at half the cycle. Meanwhile, the value of the second bit, i.e., A1 address is inverted at the cycle shifted from that of A0 address by a quarter of the cycle. The values of the third and higher bits, i.e., A2–An addresses are renewed at every one cycle.

In this case, the address signal applied from the tester designates the address for the actual writing in contrast to the burst operation in FIG. 12.

In connection with the respective bits of the address signal, however, change in signal value of each bit can be performed by inversion at every half of the cycle, so that a load on the tester can be reduced.

As data for writing, signals D and /D of which values are inverted at every half the cycle are used.

During the above write operation, signal /ADSC is always at L-level regardless of the cycle, and the address register latches the value of address in each take-in cycle. Also, signal /ADV is always at H-level, and the burst counter does not operate.

According to the above manner of writing data, data can be written without a loss even when the writing is performed at a frequency four times larger than the clock frequency set by the tester in the normal operation.

Figure 16:
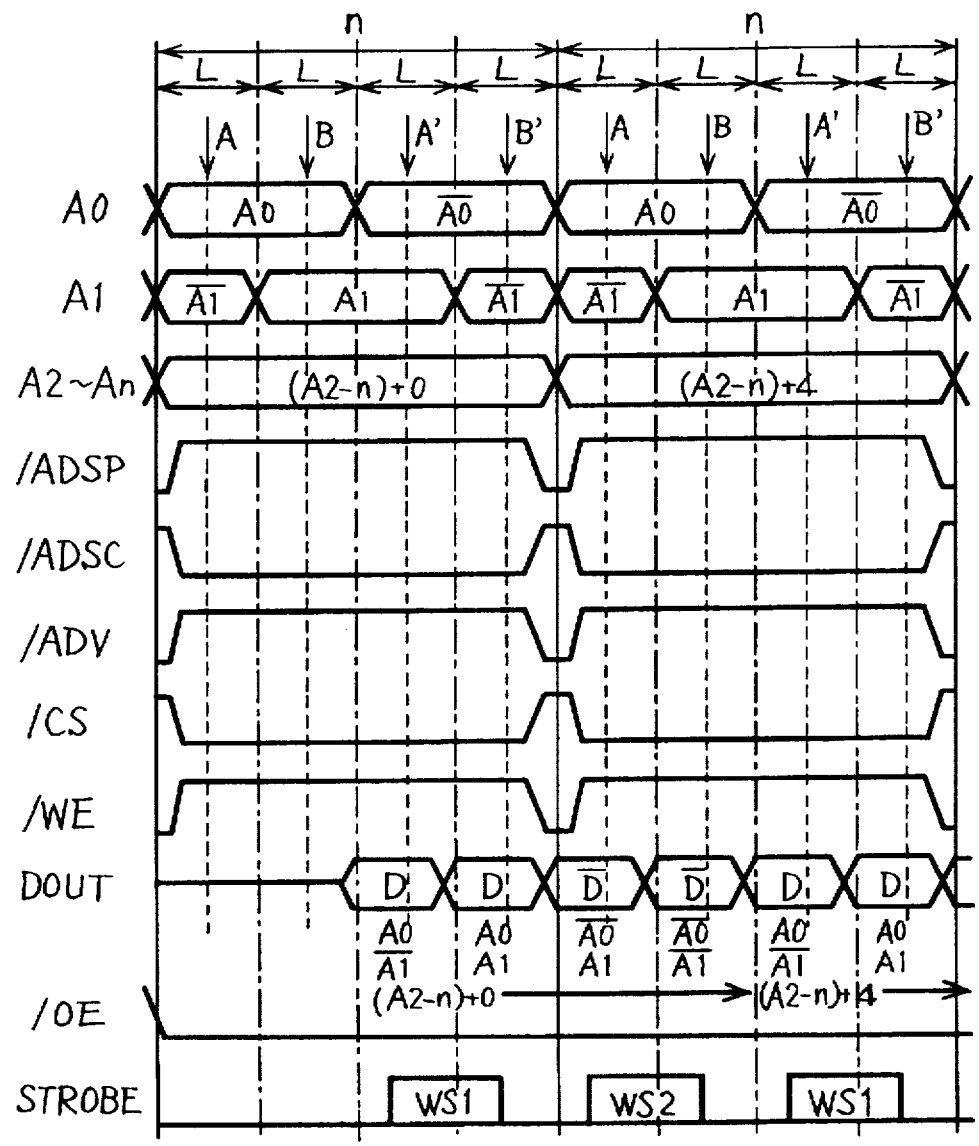
FIG. 16 is a timing chart showing a test pattern for reading and corresponding to FIG. 15.

FIG. 16 is a timing chart showing a test pattern in the normal read operation for reading the written data shown in FIG. 15, and particularly in the case where the operation is performed at a frequency four times larger than the frequency of the clock applied from the tester.

Similarly to FIG. 15, the address signal is taken in four times during one cycle, and particularly at first, second, third and fourth take-in positions A, B, A' and B' in the first cycle. In these operations, each bit of the address signal changes correspondingly to the bit change in FIG. 15.

During the operation for read operation, signal /ADSC is always at L-level regardless of the take-in position, so that the address register latches the address signal at each take-in position. Also, signal /WE is at H-level, and signal /ADV is at H-level, whereby the read operation in the normal operation is designated.

In this case, the data of 4 bits read during one cycle are output in such a manner that the same data of 2 bits are successively output at the first and second take-in positions, or at the third and fourth take-in positions, as can be seen from the write operation shown in FIG. 15. Similarly to the read operation in the burst operation shown in FIG. 14, therefore, it is possible to compare the expected value with the read data by issuing the window strobe signal two times per cycle from the tester. Although the read operation is performed four times per cycle, the tester part is required to change the address signal or determine the read data at every half the cycle, so that a load on the tester is reduced. Even when the normal read operation is performed at a frequency four times larger than the frequency set by the tester, the operation determination of the synchronous SRAM can be performed without a loss.

[Embodiment 8]

Figure 17:
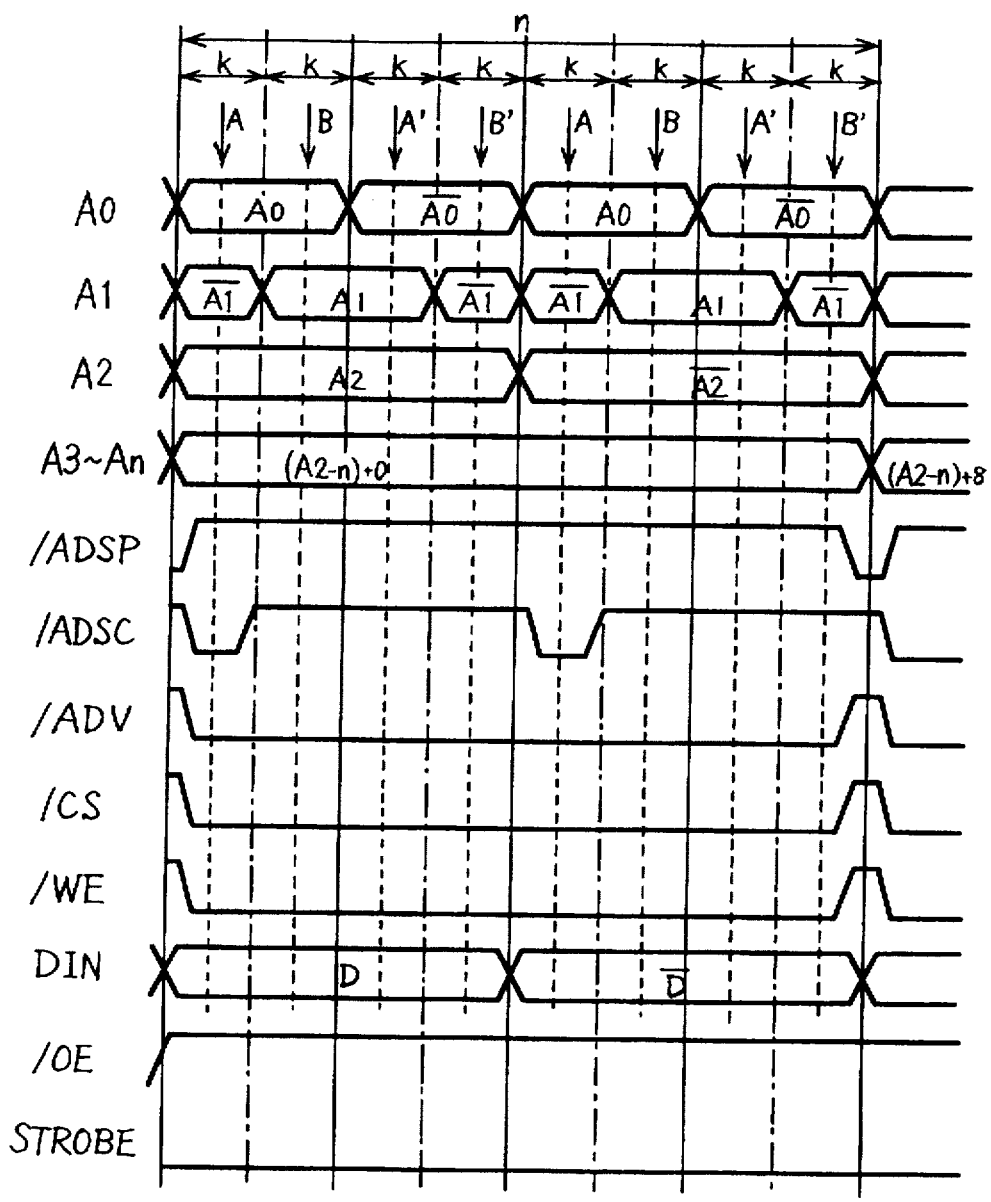
FIG. 17 is a timing chart showing a test pattern for writing in a burst operation of an embodiment 8 of the invention.

FIG. 17 is a timing chart showing a test pattern for writing in the 4-bit burst operation, and particularly in the case where the frequency to be supplied is doubled and thereby the synchronous SRAM operates at a frequency 8 times larger than the frequency under the operation of the tester.

In this case, the structure and others of the synchronous SRAM may include the structure of input control circuit 400 shown in FIG. 7. By doubling only the clock frequency, the test can be performed at a frequency higher than the frequency under the operation of the tester.

At first position A defined at the end of one-eighth of the first cycle, signal /ADSC is set to L-level, whereby a start address for the burst operation is taken in. At second, third and fourth take-in positions B, A' and B' during the first cycle, signal /ADV is at L-level, whereby the burst counter operates three times. By doubling the frequency of the clock signal to be supplied, the 4-bit burst operation is performed twice during one cycle of the tester operation.

For performing the burst operation for 8 bits, it is falsely deemed that the lower three bits of the address signal have changed into the following values, and the expected values corresponding to them are stored. Values of the fourth and higher bits of the address signal are renewed at every cycle.

The value of A0 at the lowest bit is inverted at every quarter of the cycle. The value of A1 at the second bit is inverted at every quarter of the cycle shifted by one-eighth of the cycle from address bit A0. The value of third address bit A2 is inverted at every half the cycle.

The address in the synchronous SRAM, at which data is actually written, is the address determined by the count operation of the burst counter based on the address which was taken in at first take-in position A, i.e., end of the one-eighth of the cycle. Therefore, the address which is falsely set in the tester is not coincident with the address for the actual writing.

However, the test for the read operation is performed on the assumption that the false address would change similarly, whereby the noncoincidence causes no problem at least in connection with the test operation.

The value of input data to be written is inverted at every half the cycle.

By the above write operation, the write operation itself is performed at every one-eighth of the cycle, but the processing in the tester part can be performed at a quarter or more of the cycle, so that a load on the tester can be reduced, and the continuous 8 bits can be written by the burst operation without a loss.

Figure 18:
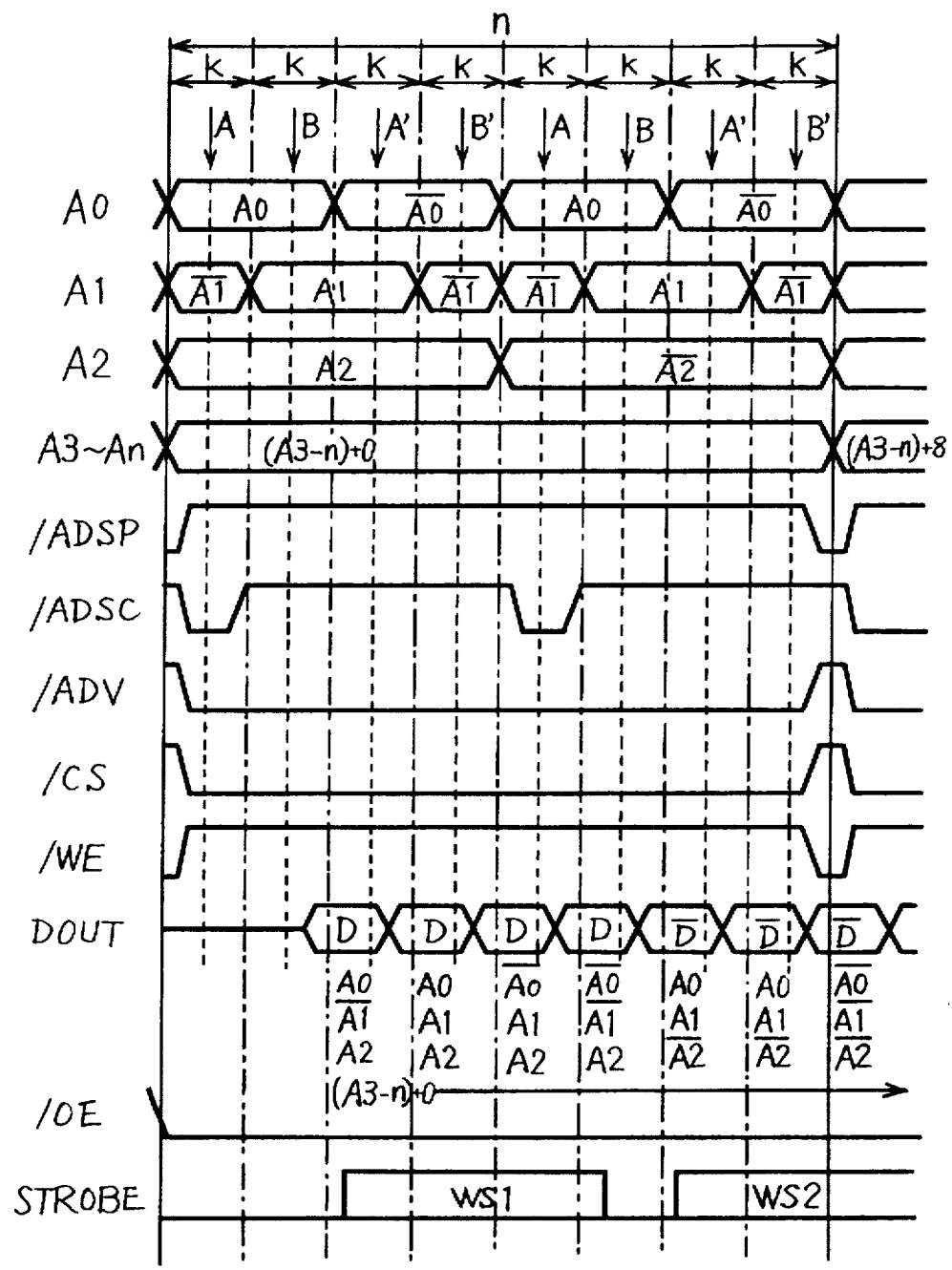
FIG. 18 is a timing chart showing a test pattern for reading and corresponding to FIG. 17.

FIG. 18 is a timing chart showing a test pattern for reading the written data in FIG. 17 by the 4-bit burst operation, and particularly in the case where the operation is performed at a frequency eight times larger than the normal test frequency.

Similarly to FIG. 17, the start address for the burst operation is taken in at take-in position A in the first cycle. Signal /ADV is at L-level at second, third and fourth take-in positions B, A' and B', whereby the burst counter operates three times in total.

The above 4-bit burst operation is performed twice in one cycle, so that data of successive 8 bits can be read.

As can be understood from the write operation in FIG. 17, all the data read from earlier 4 bits (1st to 4th bits) are the same data (D), so that the tester issues window strobe signal WS1, which allows detection of data change at every half the cycle. While window strobe signal WS1 is active, it is determined that the read data is coincident with the expect value, if no change occurs in output data DOUT.

Likewise, window strobe signal WS2 is active during reading of the subsequent 4 bits. While window strobe signal WS2 is active, it is determined that signal DOUT is coincident with the expected values if a level of read signal DOUT does not change.

As described above, the test operation can be performed without a loss, even when data of successive 8 bits are read by the burst operation.

Figure 19:
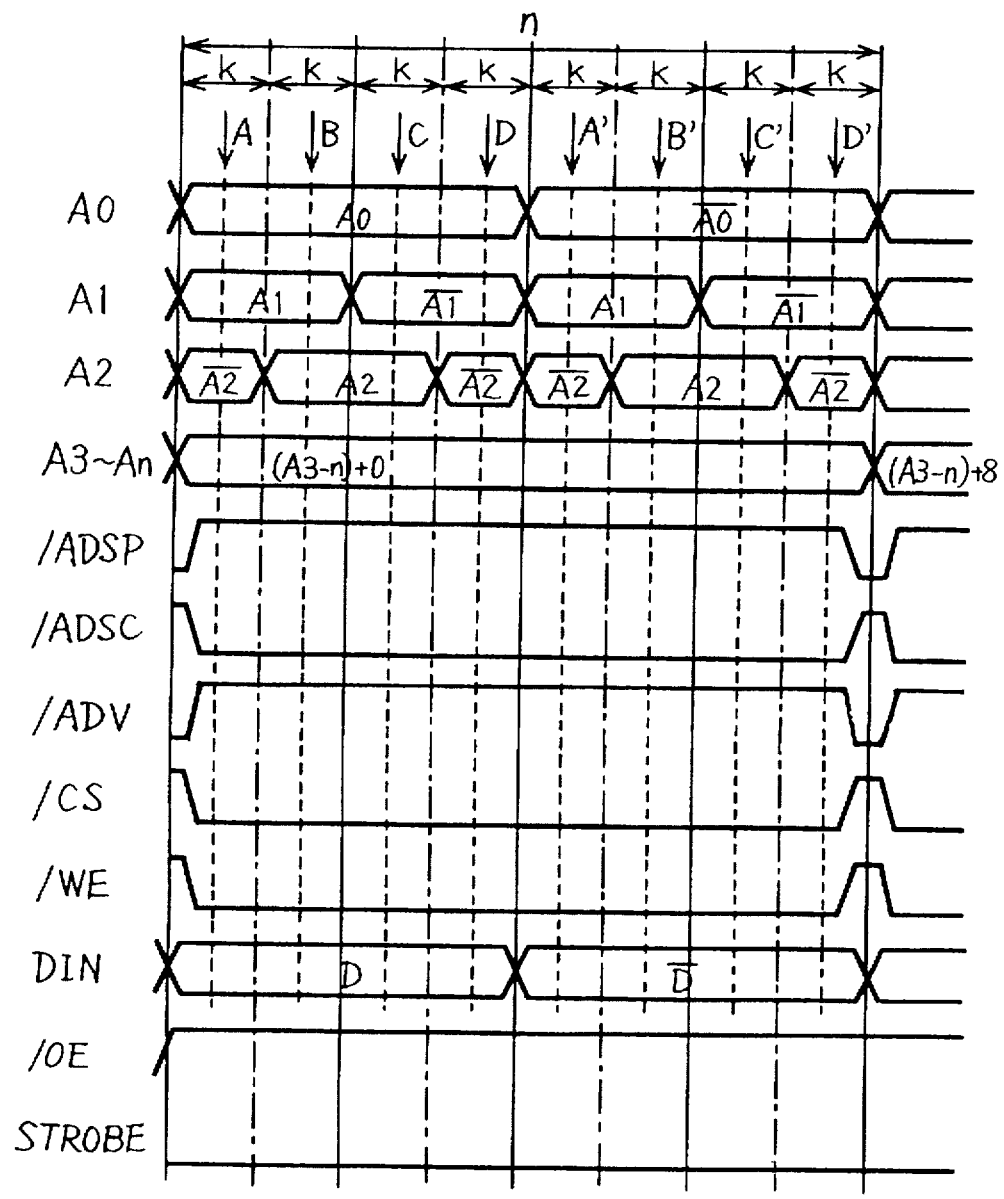
FIG. 19 is a timing chart showing a test pattern for writing in a normal operation of an embodiment 9 of the invention.

FIG. 19 is a timing chart showing a test pattern in the case where data of 8 bits are successively written by the normal operation.

Signal /ADSC is always at L-level at respective take-in positions A, B, C, D, A', B', C' and D', and the address register latches the address signal at the respective take-in positions. Meanwhile, signal /ADV is at H-level, and signal /WE is at L-level, whereby the normal write operation is designated.

Operations other than the above such as change in the address signal and input data are similar to those in the write operation by the burst operation shown in FIG. 17.

However, the change in the address signal at the tester part is not false, and data is actually written into the memory cells designated by the addresses in contrast to the write operation.

Figure 20:
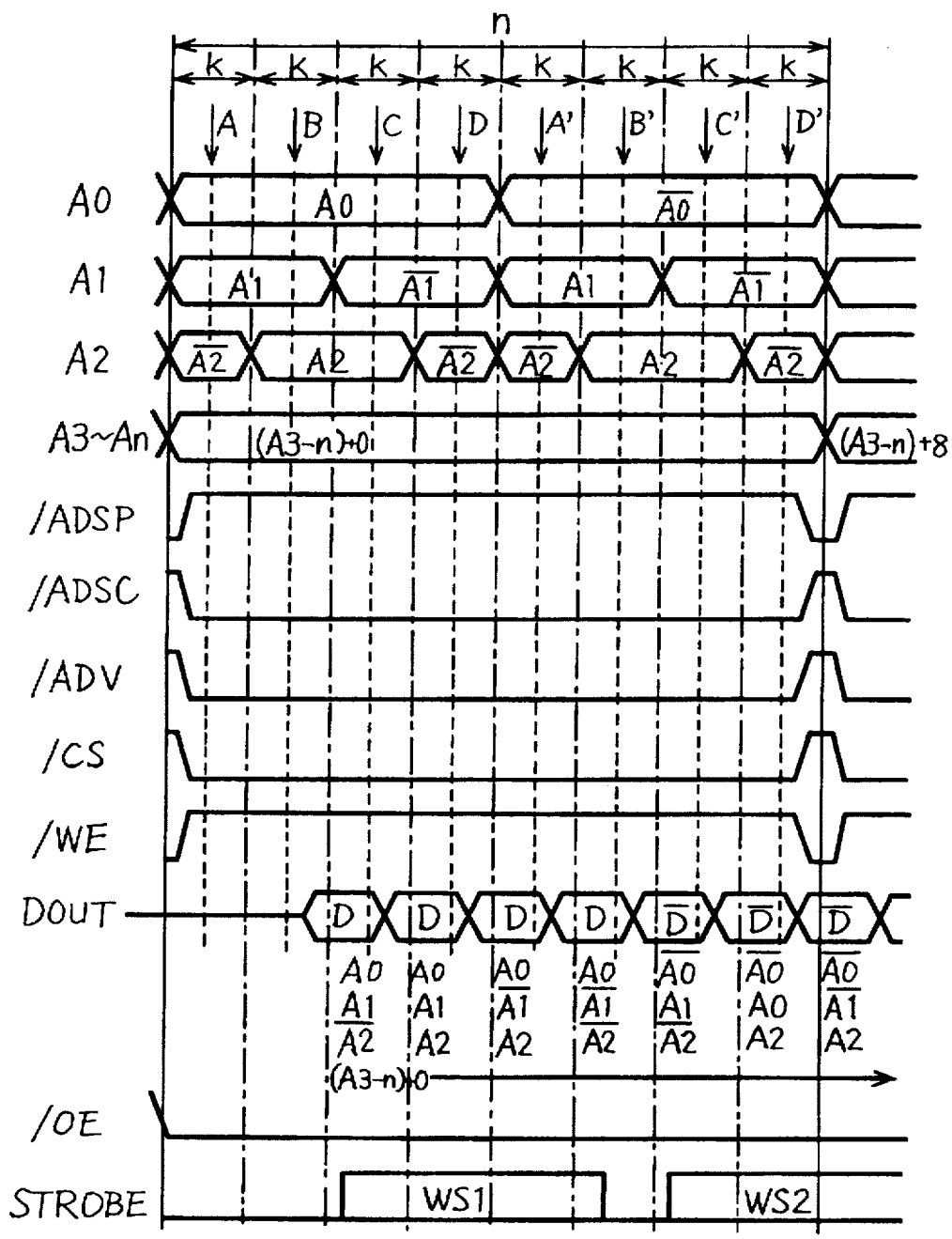
FIG. 20 is a timing chart showing a test pattern for reading and corresponding to FIG. 19.
Figure 21:
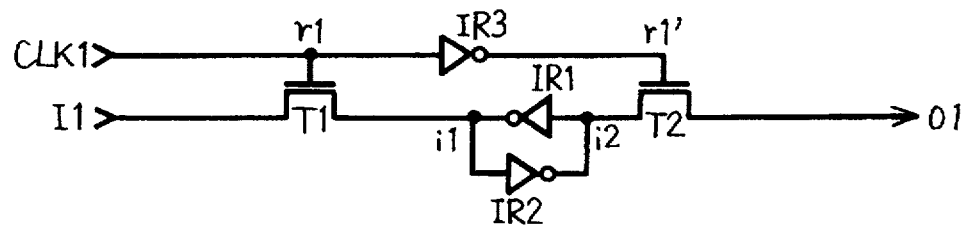
FIG. 21 shows a circuit diagram showing a structure of a conventional input control circuit 1000.
Figure 22:
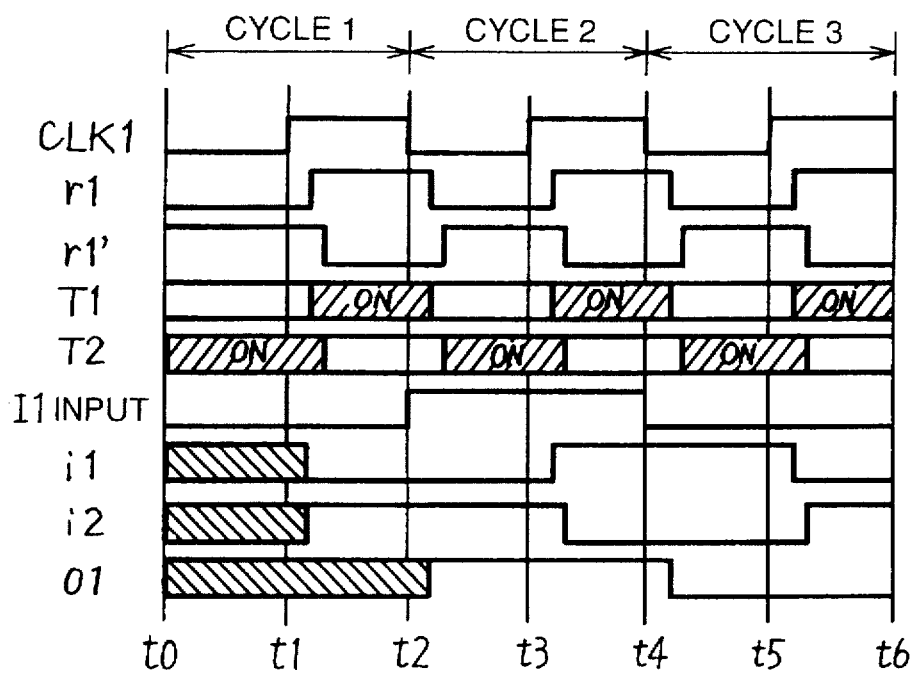
FIG. 22 is a timing chart showing an operation of the input control circuit 1000.

FIG. 20 is a timing chart showing a test pattern in the case where 8 bits of written data in FIG. 19 are successively read in the normal operation.

Assuming that the address is changed similarly to the write operation shown in FIG. 19, the following can be understood from the write operation in FIG. 19. Read data DOUT read from earlier 4 bits are the same data (D), and read data DOUT read from the subsequent 4 bits are also the same (/D). Therefore, similarly to the test operation in the burst operation mode shown in FIG. 18, the tester is designed to issue window strobe signal WS1 for detecting data change for half the cycle.

While window strobe signal WS1 is active and at H-level, it is determined that the read data is coincident with the expected value, if no change occurs at the level of signal DOUT input to the tester.

If change occurs at the level of read signal while window strobe signal WS1 is active, it is determined that the read data is not coincident with the expected value.

Likewise, data determination is effected with respect to the subsequent 4 bits while the window strobe signal is active, whereby the operation test of the synchronous SRAM can be performed efficiently.

Although the write operation itself is performed eight times during one cycle represented by "n", the test operation is required only to deal with the change for a quarter or more of the cycle, and thus a load on the tester is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device for accepting external signals including a control signal, an address signal and a data signal in synchronization with an external clock signal, comprising:
   a memory cell array including a plurality of memory cells arranged in rows and columns;
   a control circuit for accepting said control signal in response to rising of said external clock signal;
   an address register for accepting said address signal in response to rising of said external clock signal;
   memory cell select means being controlled by said control circuit to read and write data into and from said memory cell corresponding to said address signal;
   data input means for receiving said externally applied data signal and applying the same to said memory cell select means; and
   data output means for receiving the data from said memory cell select means and externally outputting the same, wherein
   said data input means and said data output means are responsive to rising and falling of said external clock signal.

2. The synchronous semiconductor memory device according to claim 1, wherein
   said data input means includes:
      first and second switch means being complementarily turned on and off in accordance with said external clock signal varying between first and second potential levels, and each receiving on one of its ends said data signal,
      first and second latch means connected to the other ends of said first and second switch means, respectively, and
      third and fourth switch means for receiving outputs of said first and second latch means, and being complementarily turned on and off oppositely to said first and second switch means, respectively; and
   said data output means includes:
      fifth and sixth switch means being complementarily turned on and off in accordance with said external clock signal, and each receiving on one of its ends the data from said memory cell select means,
      third and fourth latch means connected to the other ends of said fifth and sixth switch means, respectively, and
      seventh and eighth switch means for receiving outputs of said third and fourth latch means, and being complementarily turned on and off oppositely to said fifth and sixth means, respectively.

3. The synchronous semiconductor memory device according to claim 2, further comprising:
   input mode control means for turning off said second and fourth switch means in accordance with a test mode signal regardless of said external clock signal; and
   output mode control means for turning off said sixth and eighth switch means in accordance with said test mode signal regardless of said external clock signal.

4. The synchronous semiconductor memory device according to claim 1, further comprising:
   burst control means for externally receiving a control signal and issuing a counter control signal; and
   a burst counter for issuing an internal address signal to said memory cell select means in accordance with said counter control signal.

5. A synchronous semiconductor memory device for accepting external signals including a control signal and an address signal in synchronization with an external clock signal, comprising:
   a memory cell array including a plurality of memory cells arranged in rows and columns;
   a control circuit for accepting said control signal in response to rising of said external clock signal;
   an address register for accepting said address signal in response to rising of said external clock signal;
   memory cell select means being controlled by said control circuit to read and write a data signal into and from said memory cell corresponding to said address signal;
   data input means for receiving said externally applied data signal and applying the same to said memory cell select means; and
   data output means for receiving data from said memory cell select means and externally outputting the same, wherein
   said data input means and said data output means accepting the data signal in response to rising of said external clock signal and rising of an external sub-clock signal having a phase opposite to that of said external clock signal.

6. The synchronous semiconductor memory device according to claim 5, wherein said data input means includes:
first and second switch means being complementarily turned on and off in accordance with said external clock signal and said external sub-clock signal, and each receiving on one of its ends said data signal,
first and second latch means connected to the other ends of said first and second switch means, respectively, and
third and fourth switch means for receiving outputs of said first and second latch means, and being complementarily turned on and off oppositely to said first and second switch means, respectively; and said data output means includes:
fifth and sixth switch means being complementarily turned on and off in accordance with said external clock signal and said external sub-clock signal, and each receiving on one of its ends the data from said memory cell select means,
third and fourth latch means connected to the other ends of said fifth and sixth switch means, respectively, and
seventh and eighth switch means for receiving outputs of said third and fourth latch means, and being complementarily turned on and off oppositely to said fifth and sixth means, respectively.

7. The synchronous semiconductor memory device according to claim 6, further comprising:
input mode control means for turning off said second and fourth switch means in accordance with a test mode signal regardless of said external clock signal; and
output mode control means for turning off said sixth and eighth switch means in accordance with said test mode signal regardless of said external clock signal.

8. The synchronous semiconductor memory device according to claim 5, further comprising:
burst control means for externally receiving a control signal and issuing a counter control signal; and
a burst counter for issuing an internal address signal to said memory cell select means in accordance with said counter control signal.

9. A synchronous semiconductor memory device for accepting external signals including a control signal and an address signal in synchronization with an external clock signal, comprising:
a memory cell array including a plurality of memory cells arranged in rows and columns;
a control circuit for accepting said control signal in response to rising of said external clock signal;
an address register for accepting said address signal in response to rising of said external clock signal;
memory cell select means being controlled by said control circuit to read and write a data signal into and from said memory cell corresponding to said address signal;
data input means for receiving said externally applied data signal and applying the same to said memory cell select means; and
data output means for receiving data from said memory cell select means and externally outputting the same, wherein
said data input means and said data output means accepting the data signal in response to rising of said external clock signal and rising of an external sub-clock signal having a phase shifted by a quarter of a cycle from said external clock signal.

10. A method of writing data into a synchronous semiconductor memory device being operable continuously to accepting an externally applied data signal in response to rising and falling of an external clock signal in an externally designated specific write mode, comprising the steps of:
writing a first data signal into an address corresponding to said externally applied address signal in response to the rising of said external clock signal; and
inverting one of the bits in said address signal, and writing a second data signal formed by inverting said first data signal into a corresponding address in response to the falling of said external clock signal.

11. A method of writing data into a synchronous semiconductor memory device being operable continuously to accepting an externally applied data signal in response to rising of an external clock signal and an external sub-clock signal having a phase opposite to that of said external clock signal in an externally designated specific write mode, comprising the steps of:
writing a first data signal into an address corresponding to said externally applied address signal in response to the rising of said external clock signal; and
inverting one of the bits in said address signal, and writing a second data signal formed by inverting said first data signal into a corresponding address in response to the rising of said external sub-clock signal.

12. A method of writing data into a synchronous semiconductor memory device being operable continuously to accepting an externally applied data signal of 4 bits in response to rising and falling of an external clock signal and an external sub-clock signal having a phase shifted by a quarter of a cycle from said external clock signal in an externally designated specific write mode, comprising the steps of:
writing a first data signal into an address corresponding to said externally applied address signal in response to the rising of said external clock signal;
inverting the second least significant bit in said address signal, and writing said first data signal into a corresponding address in response to the rising of said external sub-clock signal;
inverting the least significant bit in said address signal, and writing a second data signal formed by inverting said first data signal into a corresponding address in response to the falling of said external clock signal; and
inverting the second least significant bit in said address signal, and writing said second data signal into a corresponding address in response to the falling of said external sub-clock signal.

13. A method of writing data into a synchronous semiconductor memory device being operable continuously to accepting an externally applied data signal of 8 bits in response to rising and falling of an external clock signal and an external sub-clock signal having a phase shifted by a quarter of a cycle from said external clock signal in an externally designated specific write mode, comprising the steps of:
writing a first data signal into an address corresponding to said externally applied address signal in response to the rising of said external clock signal;
inverting the second least significant bit in said address signal, and writing said first data signal into a corresponding address in response to the rising of said external sub-clock signal;

inverting the least significant bit in said address signal, and writing said first data signal into a corresponding address in response to the falling of said external clock signal;

inverting the second least significant bit in said address signal, and writing said first data signal into a corresponding address in response to the falling of said external sub-clock signal;

inverting the third least significant bit in said address signal, and writing a second data signal formed by inverting said first data signal into a corresponding address in response to the rising of said external clock signal;

inverting the second least significant bit in said address signal, and writing said second data signal into a corresponding address in response to the rising of said external sub-clock signal;

inverting the least significant bit in said address signal, and writing said second data signal into a corresponding address in response to the falling of said external sub-clock signal; and inverting the second least significant bit in said address signal, and writing said second data signal into a corresponding address in response to the falling of said external sub-clock signal.

* * * * *